United States Patent
Ishihara et al.

(10) Patent No.: US 9,812,621 B2
(45) Date of Patent: Nov. 7, 2017

(54) SEMICONDUCTOR DEVICE AND FABRICATION METHOD FOR SAME

(75) Inventors: Masamichi Ishihara, Kitakyushu (JP); Kenshu Oyama, Ogori (JP); Shoji Murakami, Nakatado-gun (JP); Hitonobu Onosaka, Nakatado-gun (JP)

(73) Assignee: SHIKOKU INSTRUMENTATION CO., LTD., Kagawa (JP)

( * ) Notice: Subject to any disclaimer, the term of this patent is extended or adjusted under 35 U.S.C. 154(b) by 404 days.

(21) Appl. No.: 14/236,584

(22) PCT Filed: Jul. 31, 2012

(86) PCT No.: PCT/JP2012/069390
§ 371 (c)(1),
(2), (4) Date: Apr. 23, 2014

(87) PCT Pub. No.: WO2013/018783
PCT Pub. Date: Feb. 7, 2013

(65) Prior Publication Data
US 2014/0327024 A1    Nov. 6, 2014

(30) Foreign Application Priority Data

Aug. 1, 2011 (JP) .................... 2011-168734
Nov. 9, 2011 (JP) .................... 2011-245821
Jun. 7, 2012 (JP) .................... 2012-129643

(51) Int. Cl.
*H01L 33/60* (2010.01)
*H01L 25/075* (2006.01)
(Continued)

(52) U.S. Cl.
CPC .............. *H01L 33/60* (2013.01); *H01L 24/97* (2013.01); *H01L 25/0753* (2013.01);
(Continued)

(58) Field of Classification Search
CPC ..... H01L 24/97; H01L 25/0753; H01L 33/60; H01L 33/486; H05K 1/056; H05K 1/0274; F21V 29/70; F21V 23/023; F21V 7/0066
(Continued)

(56) References Cited

U.S. PATENT DOCUMENTS 5,883,428 A * 3/1999 Kabumoto ............. H01L 23/50
                                                    257/532
2006/0287184 A1* 12/2006 Mori ....................... C03C 3/066
                                                    501/32
(Continued)

FOREIGN PATENT DOCUMENTS

EP    2 230 889 A1    9/2010
JP    11-068269 A     3/1999
(Continued)

OTHER PUBLICATIONS

International Search Report dated Nov. 6, 2012, issued in corresponding application No. PCT/JP2012/069390.
(Continued)

*Primary Examiner* — David Vu
*Assistant Examiner* — Mouloucoulaye Inoussa
(74) *Attorney, Agent, or Firm* — Westerman, Hattori, Daniels & Adrian, LLP

(57) ABSTRACT

A semiconductor device includes an electrical insulating layer with superior heat resistance, heat dissipation, and durability, and which is manufactured through a process with good cost performance and process performance. In a semiconductor device including a first substrate to which a semiconductor chip is mounted directly or indirectly, and a white insulating layer formed on a surface of the first substrate and functioning as a reflecting material, the semiconductor chip is an LED, at least the surface of the first
(Continued)

substrate is made of a metal, and a stacked structure of the white insulating layer and a metal layer is formed by coating a liquid material, which contains $SiO_2$ in the form of nanoparticles and a white inorganic pigment, over the surface of the first substrate and baking the coated liquid material.

14 Claims, 16 Drawing Sheets

(51) Int. Cl.
    *H01L 23/00*     (2006.01)
    *H05K 1/05*     (2006.01)
    *H01L 33/62*     (2010.01)

(52) U.S. Cl.
    CPC ............. *H05K 1/056* (2013.01); *H01L 33/62* (2013.01); *H01L 2224/16225* (2013.01); *H01L 2224/48091* (2013.01); *H01L 2224/48137* (2013.01); *H01L 2224/48227* (2013.01); *H01L 2224/48228* (2013.01); *H01L 2224/73265* (2013.01); *H01L 2224/97* (2013.01); *H01L 2924/01029* (2013.01); *H01L 2924/07802* (2013.01); *H01L 2924/12041* (2013.01); *H01L 2924/12042* (2013.01); *H01L 2924/15747* (2013.01); *H01L 2924/15787* (2013.01); *H01L 2924/181* (2013.01); *H05K 2201/0209* (2013.01); *H05K 2201/10106* (2013.01); *H05K 2201/2054* (2013.01)

(58) Field of Classification Search
    USPC ................... 257/98, 88, 99, E33.07; 438/27; 362/294, 247, 301, 249.02, 296.01
    See application file for complete search history.

(56) References Cited

U.S. PATENT DOCUMENTS

| | | | |
|---|---|---|---|
| 2007/0066078 A1 | 3/2007 | Kugler et al. | |
| 2008/0224608 A1* | 9/2008 | Konishi | F21K 9/00 313/505 |
| 2010/0137475 A1 | 6/2010 | Takeyama et al. | |
| 2010/0164362 A1* | 7/2010 | Miyakawa | H05K 1/0274 313/498 |
| 2011/0042813 A1 | 2/2011 | Crain et al. | |
| 2011/0190429 A1 | 8/2011 | Muhammad et al. | |
| 2011/0290543 A1 | 12/2011 | Takeuchi et al. | |
| 2011/0291151 A1* | 12/2011 | Matsuda | H01L 25/0753 257/99 |
| 2012/0014110 A1* | 1/2012 | Sanpei | F21K 9/00 362/296.04 |
| 2012/0148832 A1* | 6/2012 | Yabuta | B01J 21/063 428/331 |

FOREIGN PATENT DOCUMENTS

| | | |
|---|---|---|
| JP | 2005-167086 A | 6/2005 |
| JP | 2006-245032 A | 9/2006 |
| JP | 2007-083723 A | 4/2007 |
| JP | 2009-004718 A | 1/2009 |
| JP | 2009-257722 A | 11/2009 |
| JP | 4904604 B1 | 3/2012 |
| WO | 2009/008509 A1 | 1/2009 |
| WO | 2009/060441 A2 | 5/2009 |

OTHER PUBLICATIONS

Extended European Search report dated Jan. 30, 2015, issued in counterpart application No. 12 82 0247. (2 pages).
Office Action dated Aug. 1, 2016, issued in counterpart Taiwanese Application No. 101127725. (5 pages).

* cited by examiner

[Fig. 1]
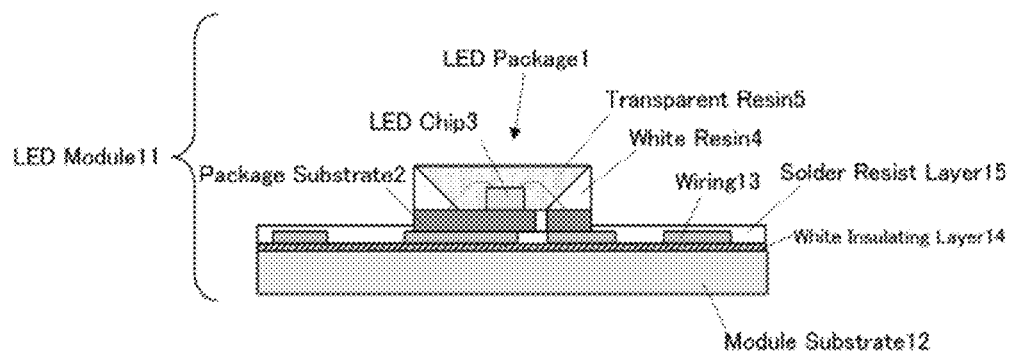
[Fig. 2]
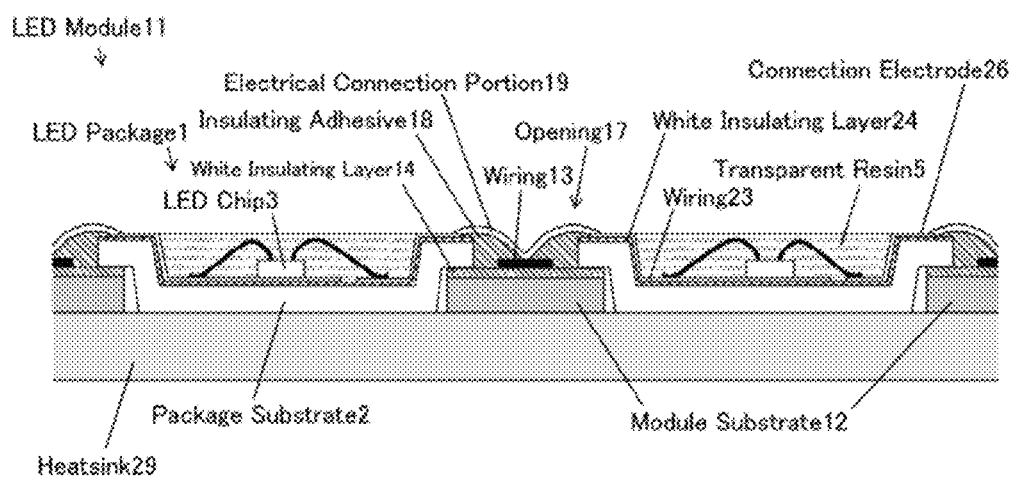

[Fig. 3]
(a)
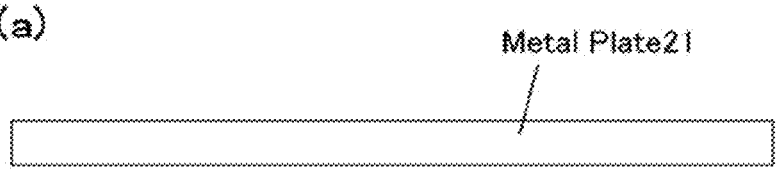
(b)
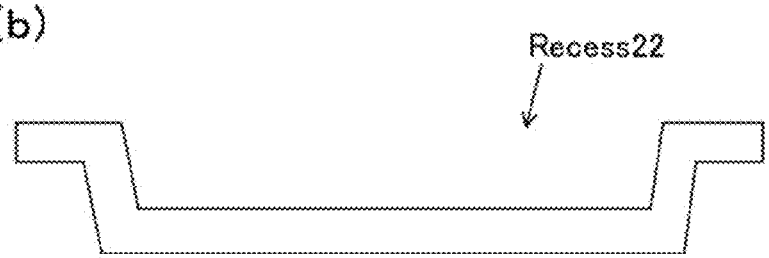
(c)
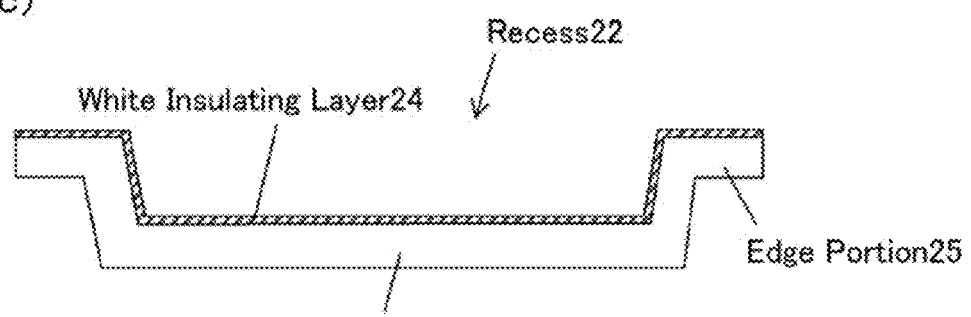
(d)
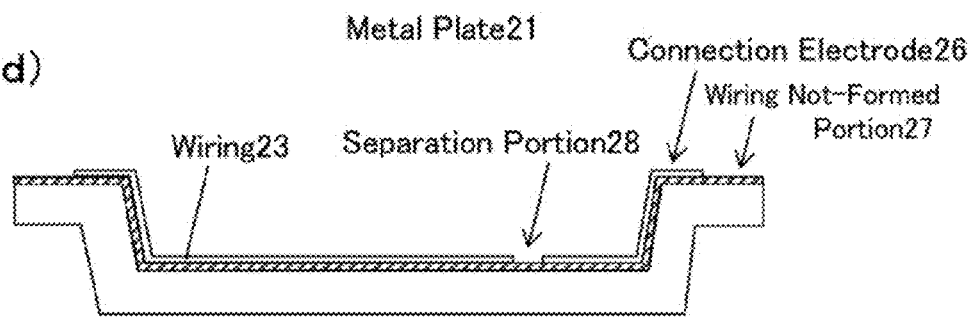

[Fig. 4]
(a) Fixing of LED Package
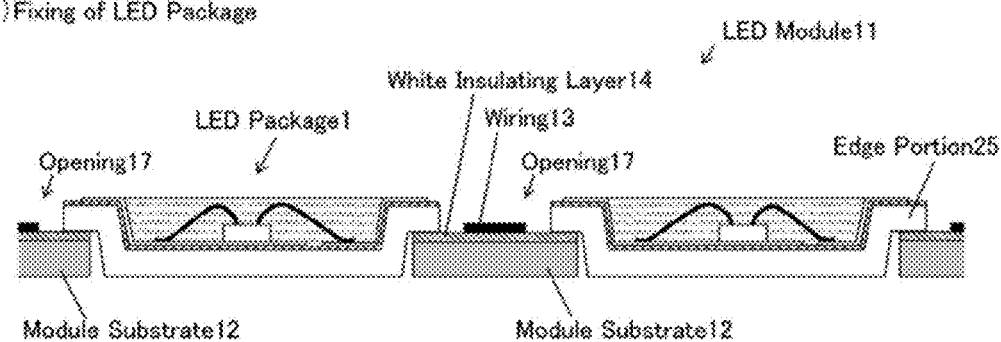
(b) Electrical Connection
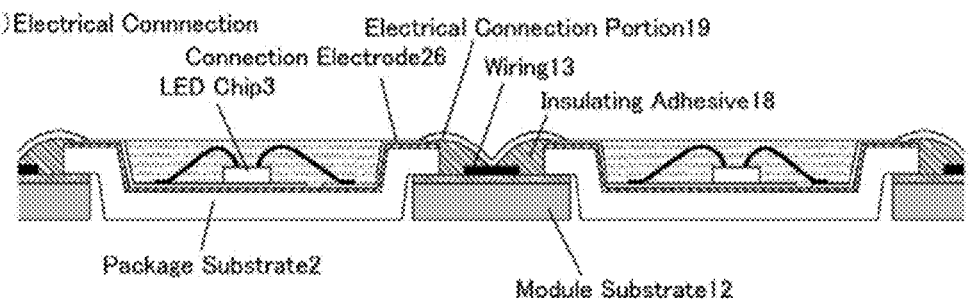
(c) Fixing of Heatsink
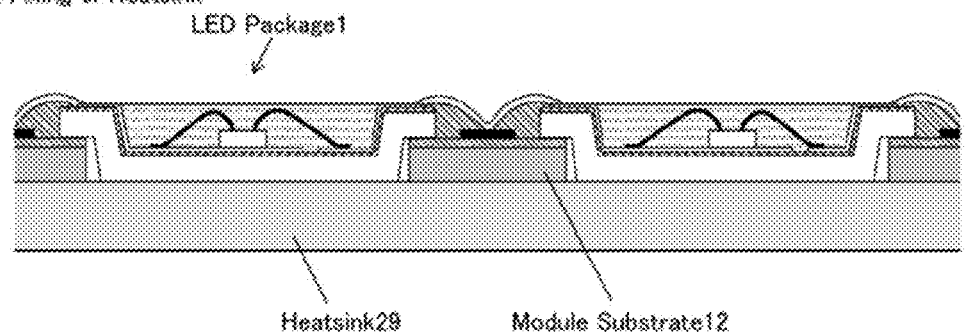

[Fig. 5]
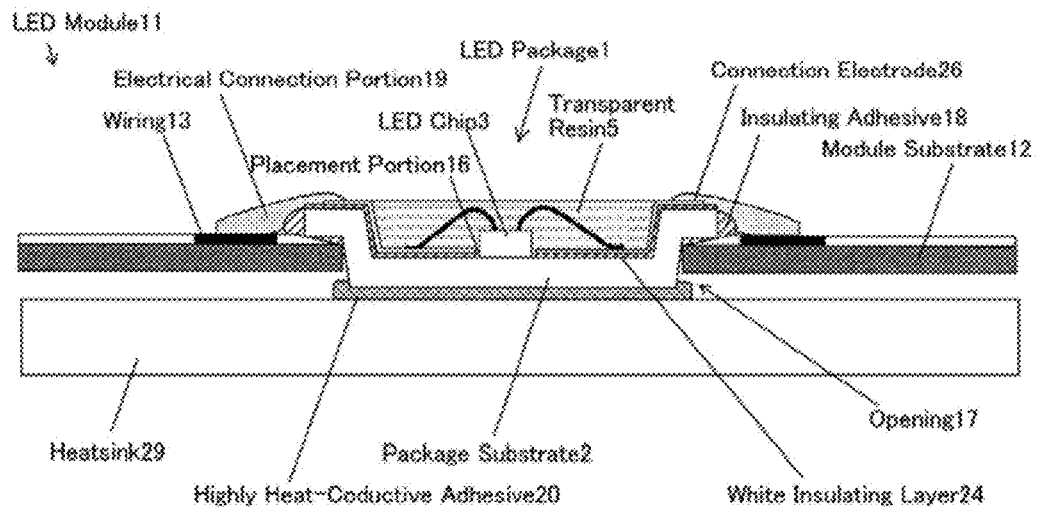
[Fig. 6]
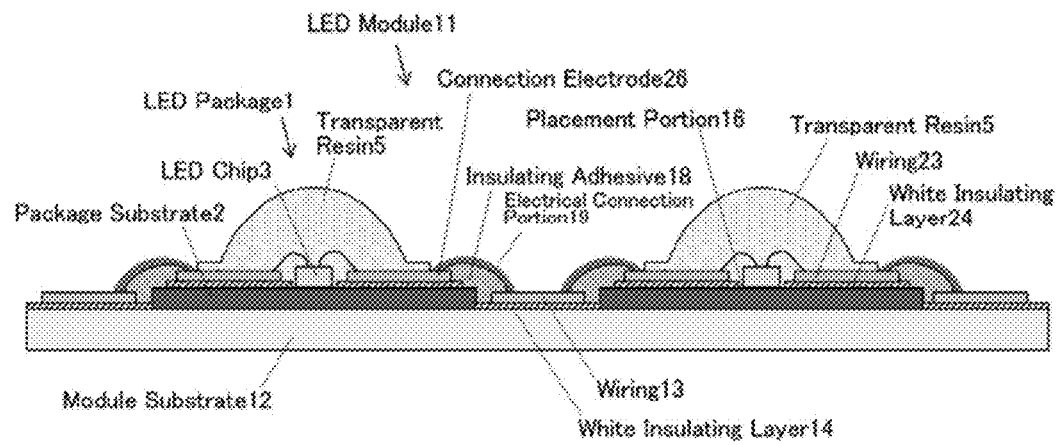

[Fig. 7]
(a) Module Substrate of Second Configuration Example
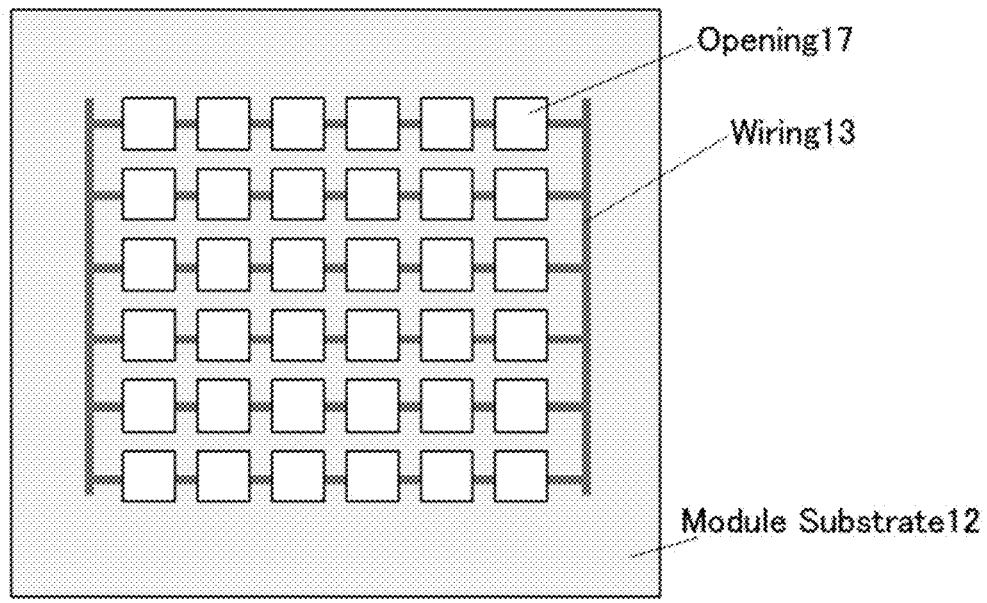
(b) Module Substrate of Fourth Configuration Example
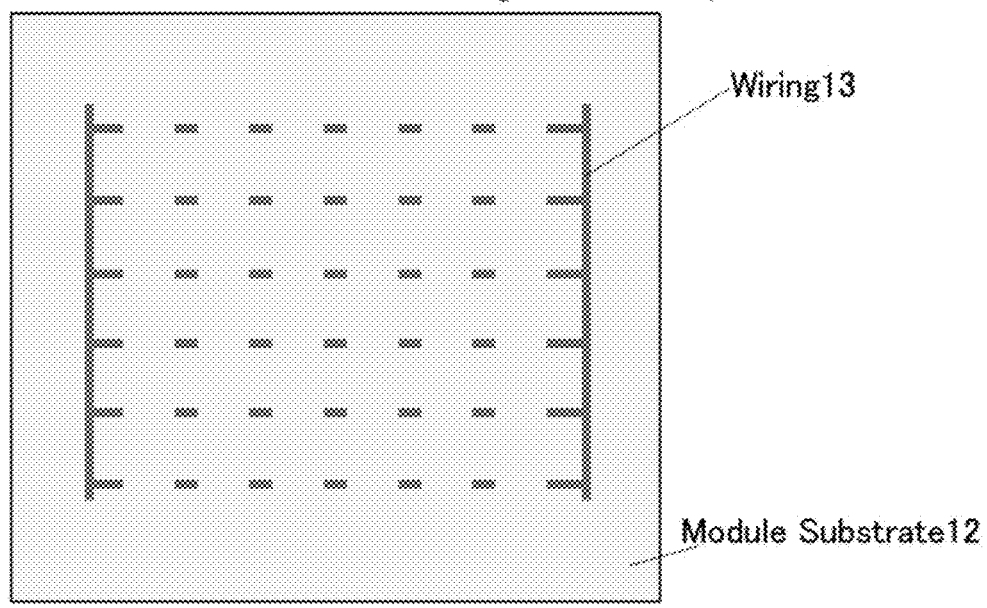

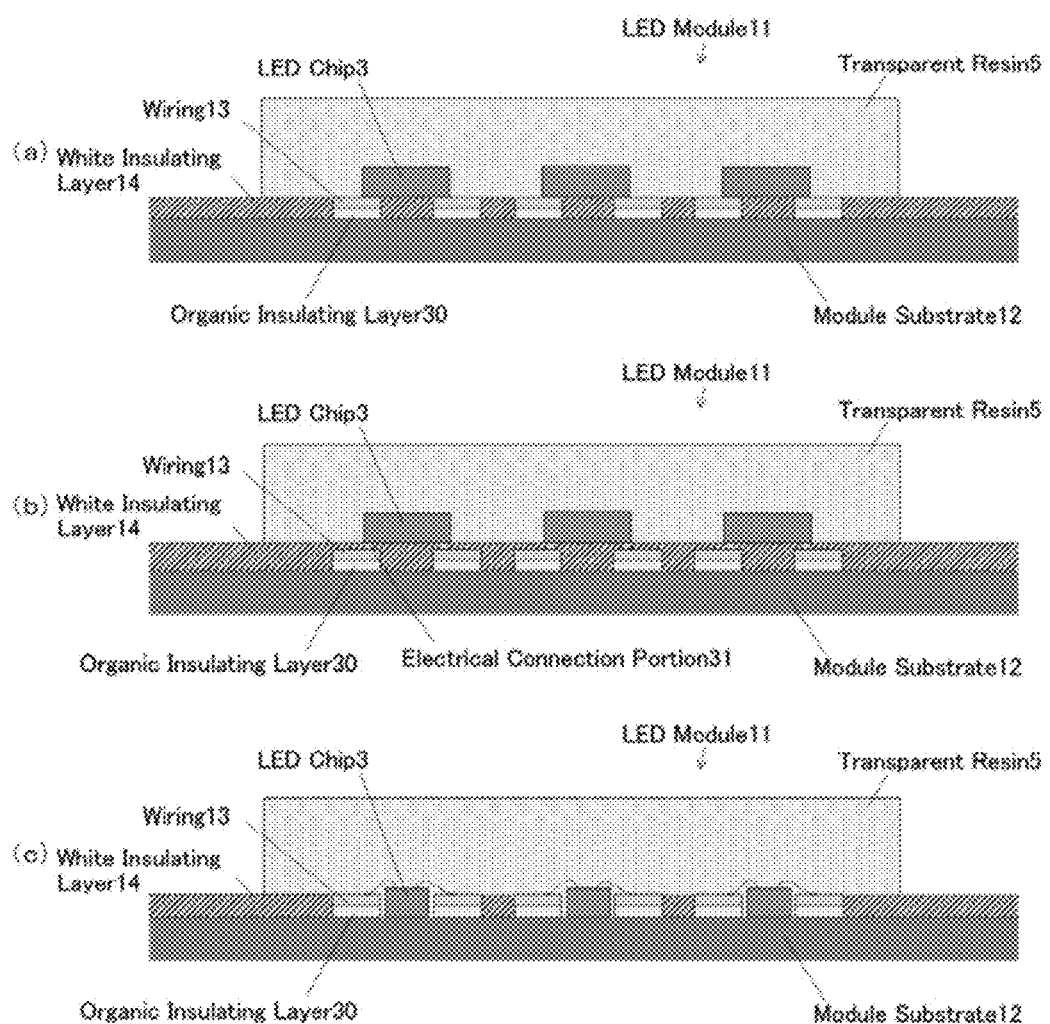
[Fig. 8]

[Fig. 9]
STEP1 Forming of Organic Insulating Layer and Copper Foil Layer on Substrate
STEP2 Patterning of Copper Foil
STEP3 Removal (Etching) of Organic Insulating Layer with Copper Foil Used as Mask
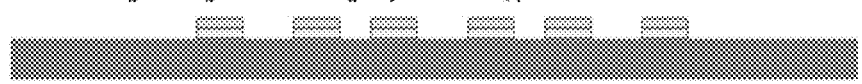
STEP4 Coating of White Inorganic Material
(a) Substantially Flush with Wiring
(b) Partly Overlapping with Wiring
[Fig. 10]
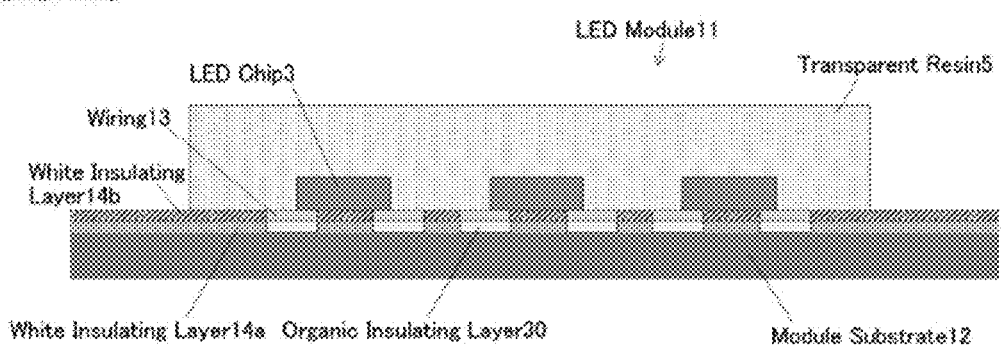

[Fig. 11]
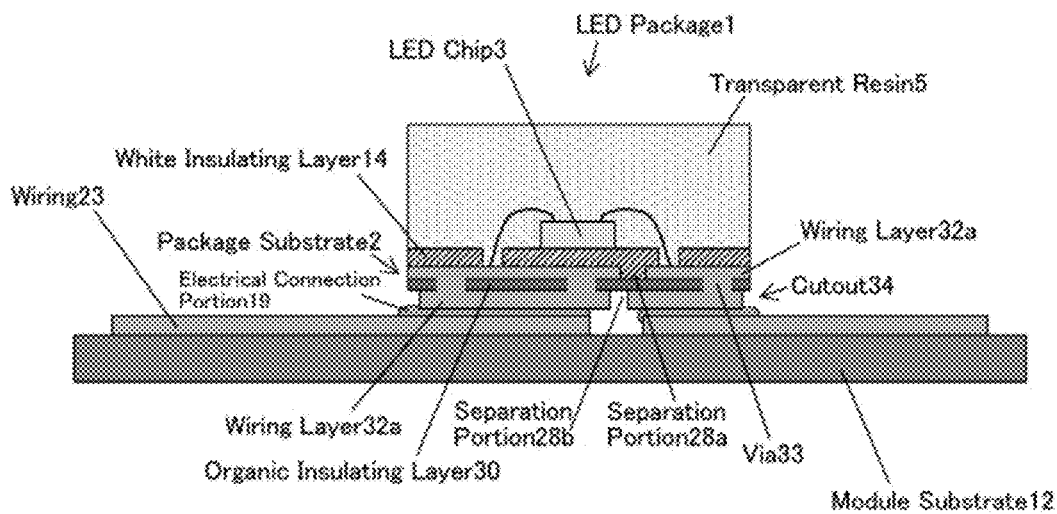
[Fig. 12]
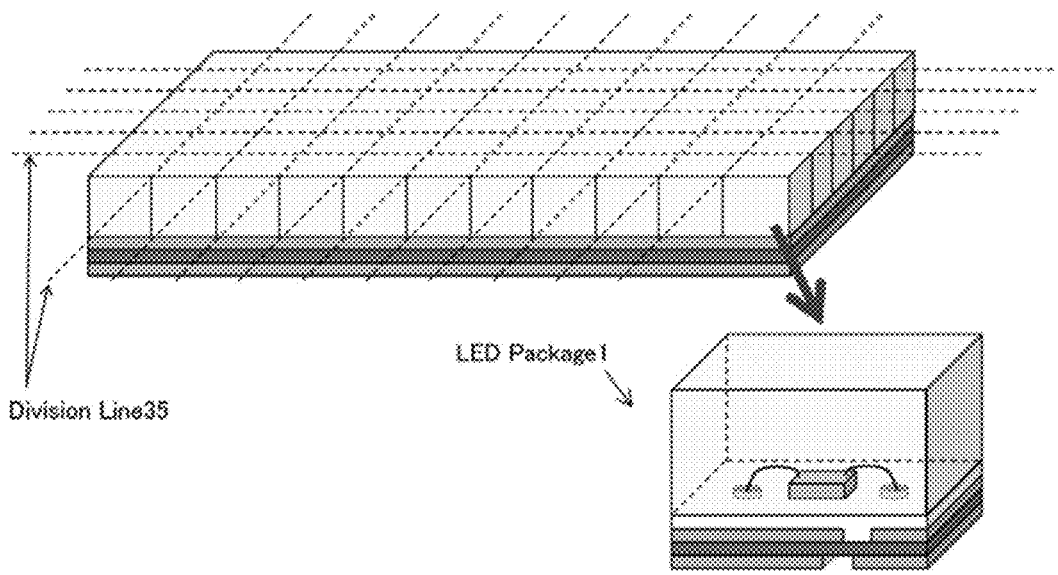

[Fig. 13]
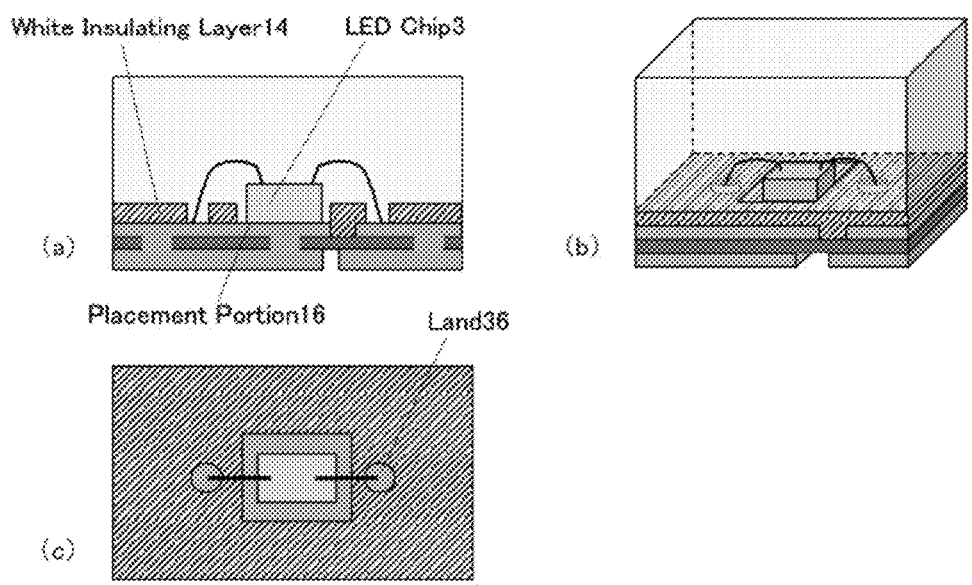
[Fig. 14]
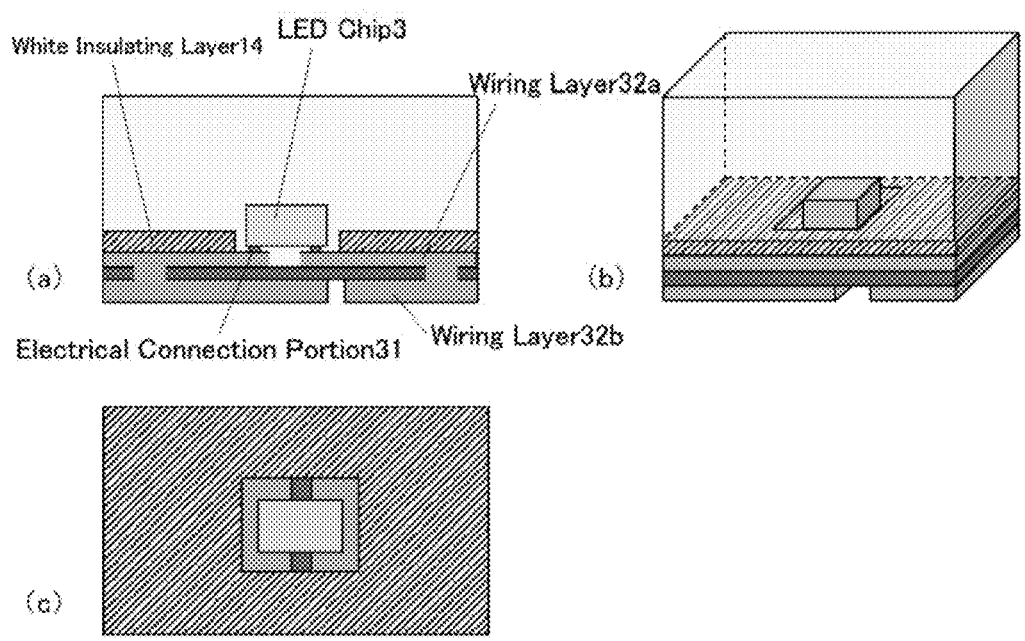

[Fig. 15]
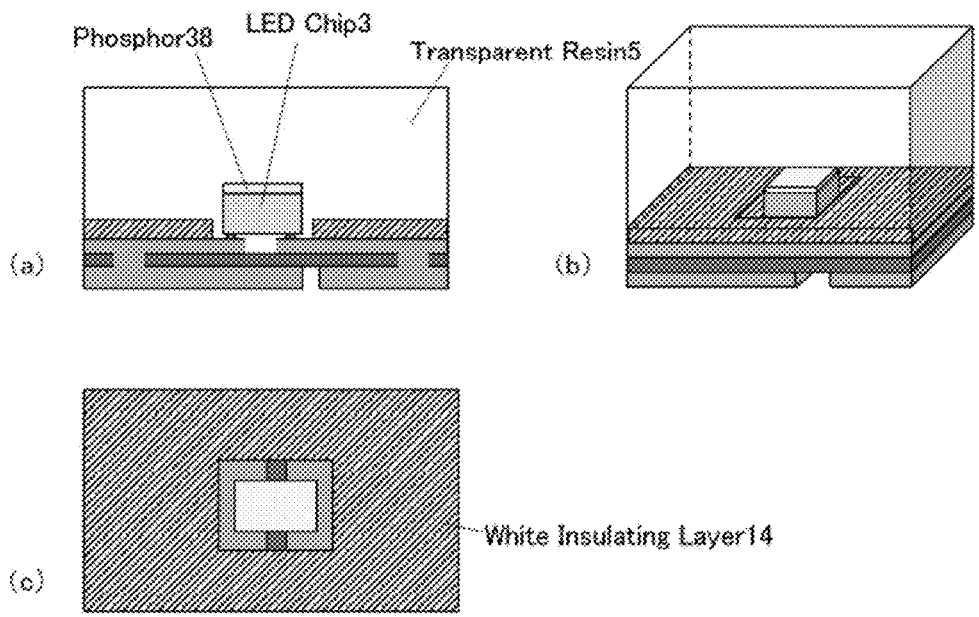
[Fig. 16]
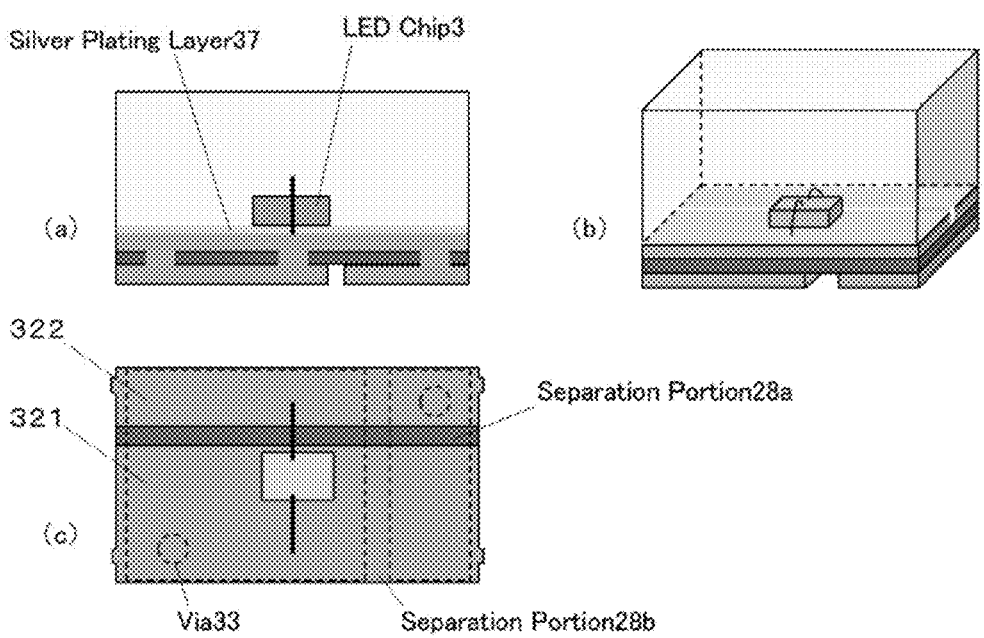

[Fig. 17]
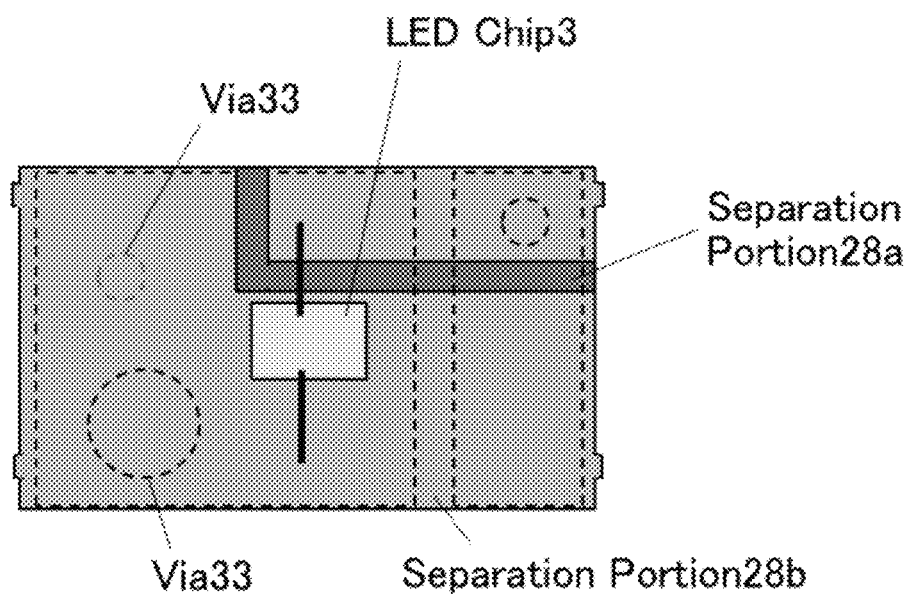
[Fig. 18]
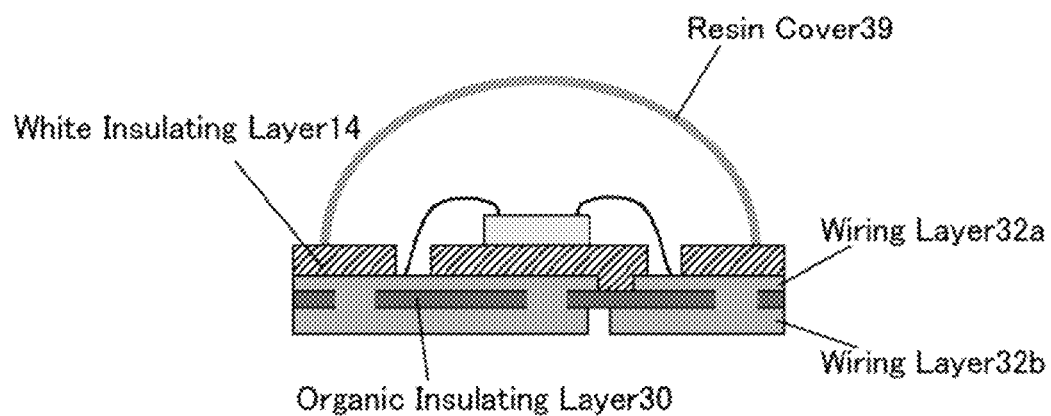

[Fig. 19]
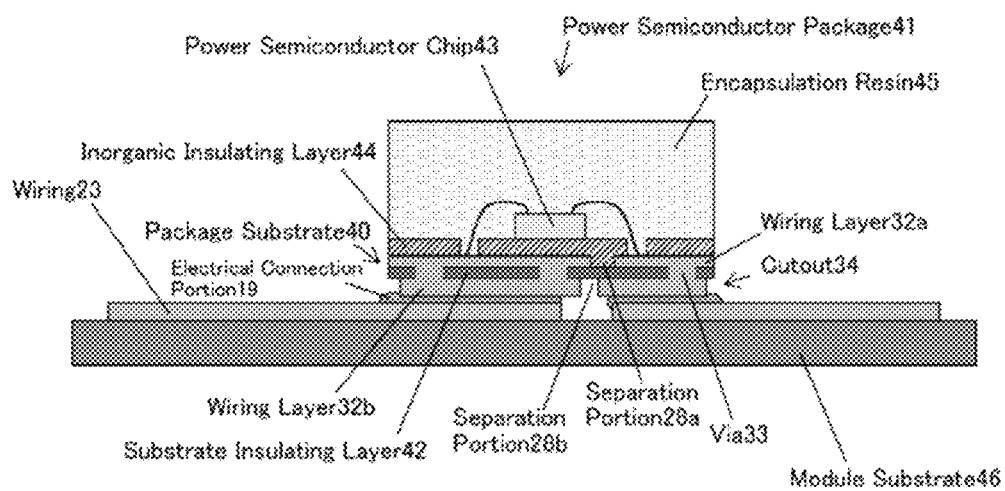
[Fig. 20]
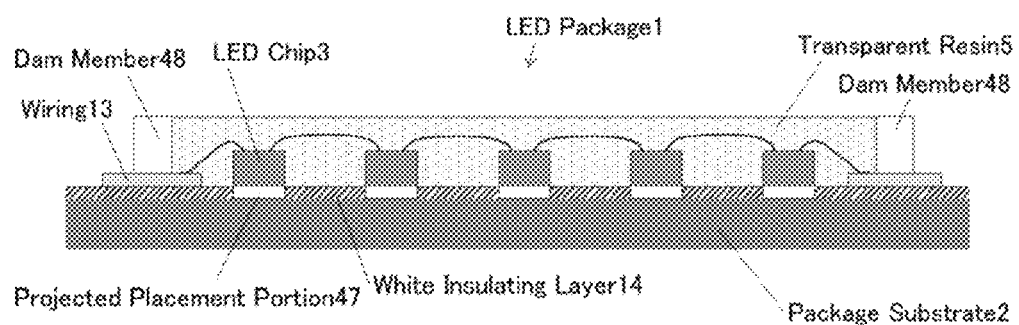

[Fig. 21]
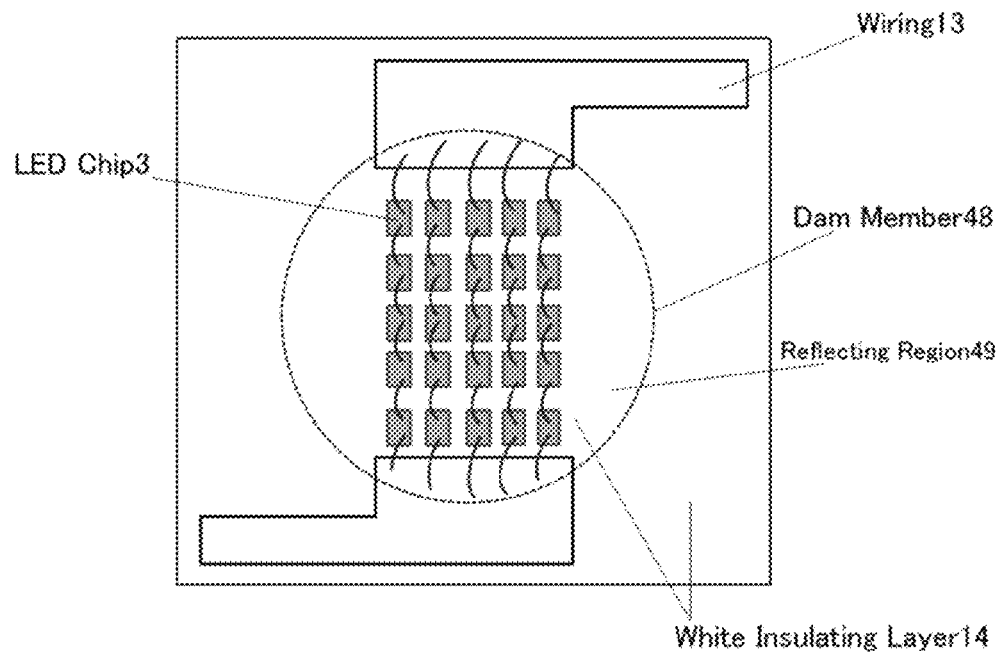
[Fig. 22]
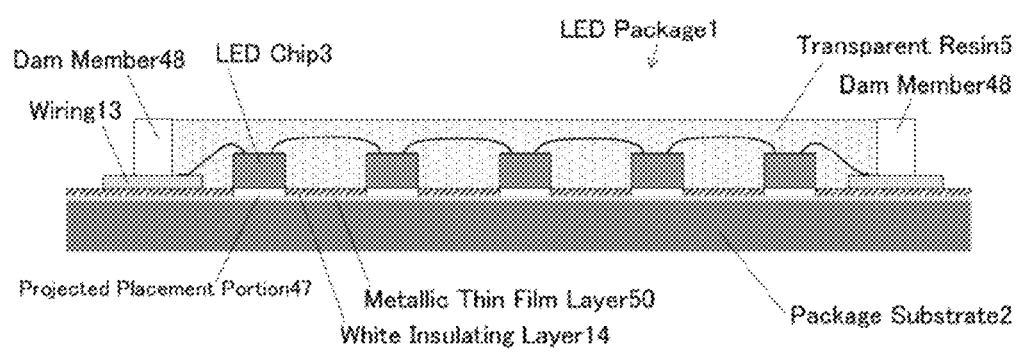

[Fig. 23]
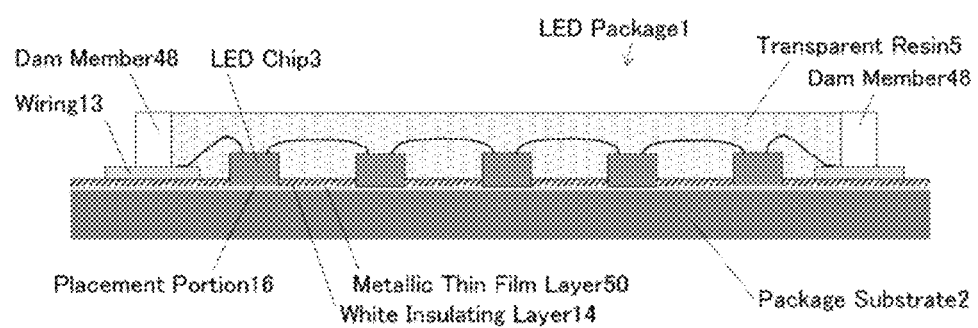

[Fig. 24]
(A)
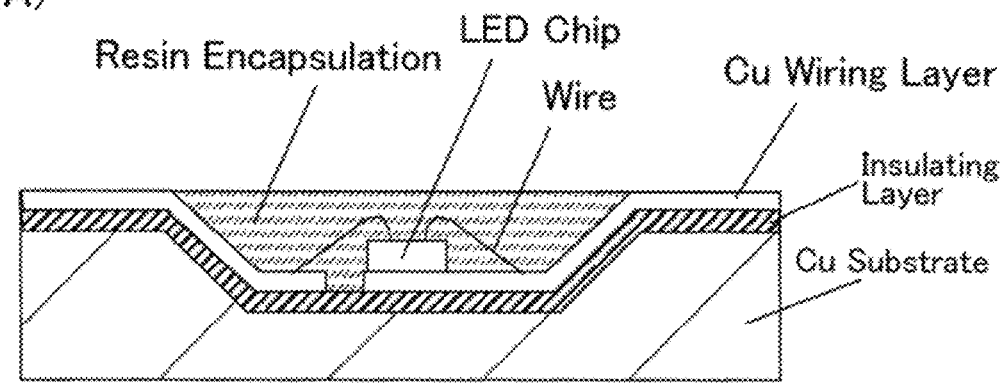
(B)
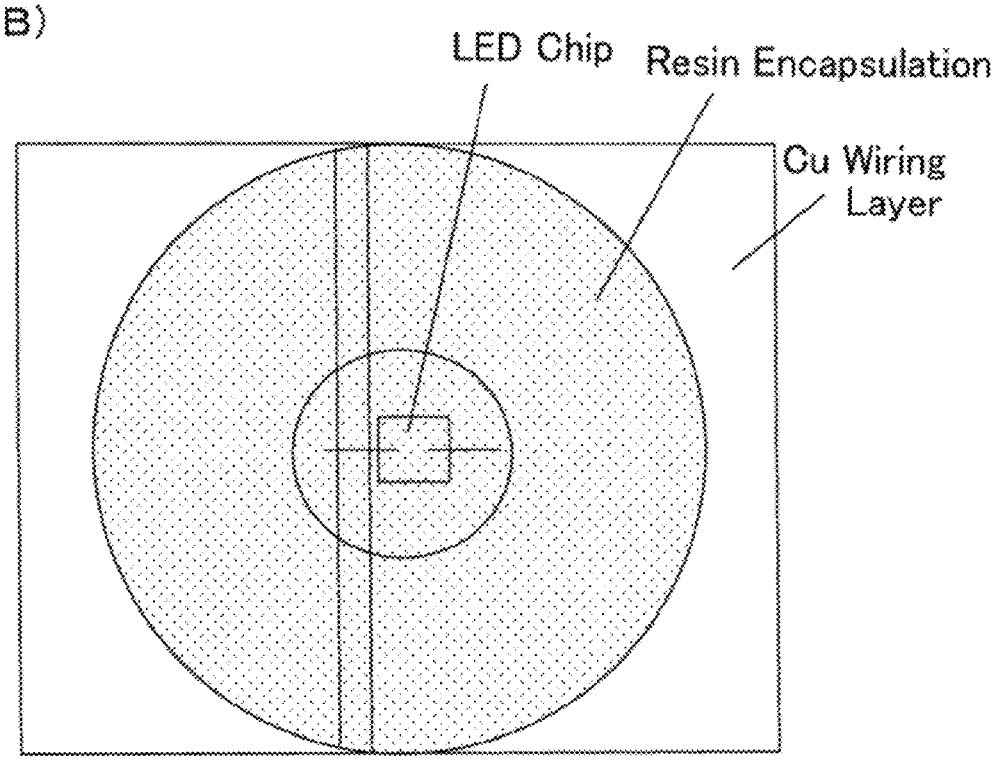

[Fig. 25]
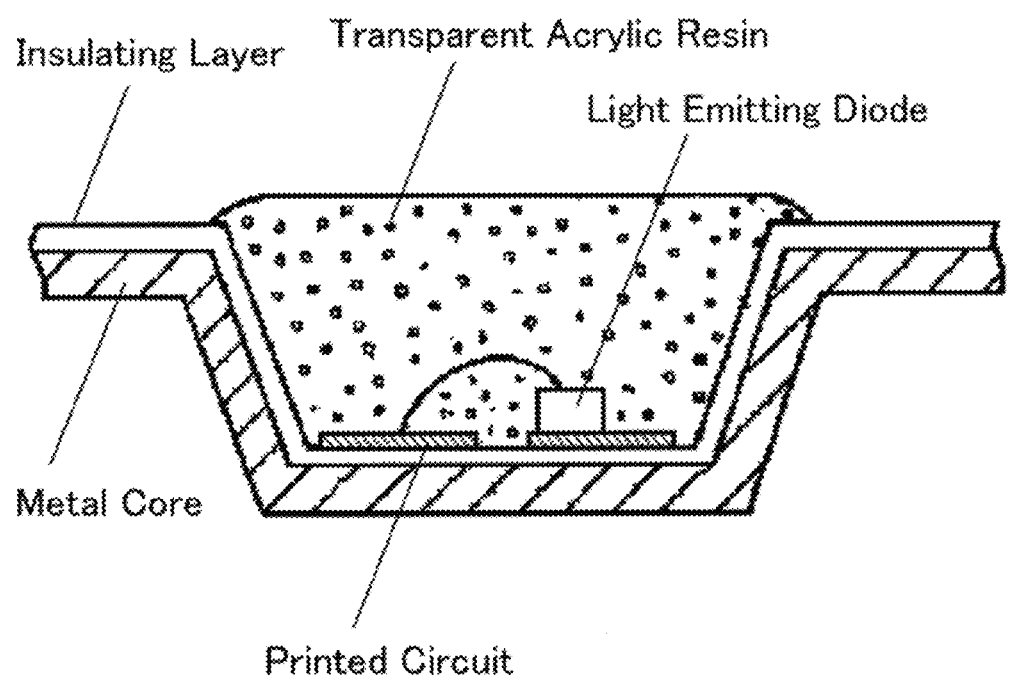

SEMICONDUCTOR DEVICE AND FABRICATION METHOD FOR SAME

TECHNICAL FIELD

The present invention relates to a semiconductor device including a white inorganic insulating layer that functions as a reflecting material and that is superior in heat resistance, heat dissipation, and durability, and to a manufacturing method for the semiconductor device. More particularly, the present invention relates to an LED luminescent device including a white insulating layer that is formed, for example, by coating a liquid material, which contains $SiO_2$ in the form of nanoparticles and a white inorganic pigment, over a metal surface and baking the coated liquid material, and to a manufacturing method for the LED luminescent device.

BACKGROUND ART

An LED (Light Emitting Diode) is widely used as a device having low power consumption, contributing to reduction of carbon dioxide, and exhibiting high durability, namely as a device that contributes to environmental protection and energy saving. A package incorporating such an LED chip is mounted onto a wiring substrate (module substrate) and is used for not only backlights in electronic equipment, e.g., a large-sized display, a cellular phone, a digital video camera, and a PDA, but also for road illumination, general illumination, and so on. In trying to increase the emission intensity of the LED device, heat generates in a larger amount, and the emission efficiency of the LED device reduces with heating. Therefore, the LED device is required to include a structure capable of effectively dissipating heat.

A current LED luminescent device employs a ceramic substrate, a silicon substrate, or a metal substrate as an LED package substrate. However, known structures employing the ceramic substrate or the silicon substrate have the problems that heat is not effectively dissipated because ceramics and silicon have lower thermal conductivity than metals, such as copper, that those substrates are relatively expensive, and that a difficulty occurs in processing of the substrates.

FIG. 25 is a side sectional view illustrating a lighting fixture disclosed in Patent Document 1. An illustrated metal-core printed circuit board includes a metal core and a printed circuit that is formed, by processing a copper foil into a circuit pattern, on the metal core with an insulating layer interposed between them. The insulating layer is made of a heat-resistant and thermoplastic resin having a thickness of about 100 μm, the resin being any of polyether ether ketone, polyether imide, and polyether sulfone. A light emitting diode is placed on and fixed to a bottom surface of a recess of the metal-core printed circuit board, and terminals of the light emitting diode are connected to the printed circuit. A transparent acrylic resin is filled in the recess. Thus, it is known to use the heat-resistant and thermoplastic resin as the insulating layer, but the insulating layer made of the resin has a problem with heat dissipation.

Hitherto, a liquid material obtained by adding a white inorganic pigment to a thermo-setting resin made of an organic material is proposed as a composition capable of forming a high-reflectance solder resist film (e.g., Patent Document 2). The white inorganic pigment has a particle diameter of 0.3 μm or smaller, for example. The liquid material containing the pigment having such a particle diameter cannot be coated with an ink jet applicator, a dispenser, or a spray coater, and screen printing has to be employed. Moreover, heat dissipation performance of organic materials is generally about 0.3 w/m·k and is inferior to that of inorganic materials (e.g., silicon dioxide ($SiO_2$): about 1.5 w/m·k, titanium dioxide: about 8 w/m·k, and zinc oxide: about 50 w/m·k). In addition, a wiring substrate including an insulating layer made of an organic material has problems with heat resistance and deterioration due to ultraviolet rays or long-term use (i.e., durability).

Patent Document 3 discloses an LED package employing, as a base material, a Cu substrate including a thin-film Cu wiring layer, which is integrally formed on its surface, while an insulating layer made of silicon dioxide ($SiO_2$) is interposed between them as a bonding material. FIG. 24 illustrates an LED package disclosed in Patent Document 3. FIG. 24(A) is a side sectional view of a central portion of the package, and FIG. 24(B) is a plan view of the central portion. In the Cu substrate mounting the LED chip thereon, a concave recess receiving the mounted LED chip is formed by pressing. However, $SiO_2$ is hard and tends to fracture during the pressing. Hence there is a problem that $SiO_2$ is unsuitable for the pressing. Moreover, an Ag plating is coated on the surface of the Cu wiring layer to give the surface with light reflectance, thus resulting in a higher cost.

Recently, a heat pipe for cooling a heat source through evaporation and condensation of an enclosed coolant has been proposed for mounting into even a small space. Patent Document 4 proposes a heat pipe comprising a flat-plate main unit including a vapor diffusion channel through which the evaporated coolant is diffused and a capillary channel through which the condensed coolant is returned, a temperature measuring unit that measures a temperature difference between at least two locations of the main unit, a comparison unit that compares the temperature difference with a predetermined threshold and that outputs a comparison result, and a determination unit that determines, in accordance with the comparison result, an operating state of the main unit on the basis of a cooling capability of the heat pipe, wherein the vapor diffusion channel diffuses the evaporated coolant in a horizontal direction, and the capillary channel returns the condensed coolant in a vertical direction or in the vertical and horizontal directions.

LIST OF PRIOR-ART DOCUMENTS

Patent Documents

Patent Document 1: Japanese Patent Laid-Open Publication No. H11-68269
Patent Document 2: Japanese Patent Laid-Open Publication No. 2009-4718
Patent Document 3: Japanese Patent Laid-Open Publication No. 2006-245032
Patent Document 4: Japanese Patent Laid-Open Publication No. 2009-257722

SUMMARY OF THE INVENTION

Problems to be Solved by the Invention

In general, an insulated metal plate for a semiconductor chip has the problem that, because an electrical insulating layer positioned at a lower surface of the semiconductor chip contains an organic material as a main component and is poor in thermal conductivity, a good heat dissipation characteristic cannot be obtained. In view of limitation of the organic material in heat resistance, heat dissipation, or durability, using an inorganic material to form the electrical insulating layer is a problem to be solved by the present invention.

Another problem to be solved by the present invention is to reduce a material cost of a reflecting material (for example, a silver plating used as the reflecting material has a high cost) in a semiconductor device (i.e., an LED luminescent device) in which a semiconductor chip is an LED. Furthermore, a reflecting wall (see reference numeral 4 in FIG. 1) made of a white resin has the problems that the color of the reflecting wall is apt to change due to oxidation of the resin caused by light and heat generated from the LED, and that reflectance reduces with the lapse of time. Thus, an LED luminescent device is demanded which does not use expensive materials, and which includes a reflecting material having good durability.

Still another problem to be solved by the present invention is to reduce a cost by simplifying a manufacturing process.

In view of the problems described above, an object of the present invention is to provide a semiconductor device which includes an electrical insulating layer with superior heat resistance, heat dissipation, and durability, and which is manufactured through a process with good cost performance and process performance.

Means for Solving the Problems

In the past, a white inorganic pigment has been used as a liquid material in a state mixed with an organic material. Because that type of liquid material cannot be coated by the ink jet method or the dispenser method, it has been coated only by screen printing.

The inventors have found that, by employing ink in which silicon dioxide ($SiO_2$) in the form of nanoparticles and a white inorganic pigment are mixed with each other, a white inorganic insulating material can be used as ink capable of being coated by the ink jet method, the dispenser method, or the spray coating method, and the ink can be coated to form a desired pattern or to cover an irregular portion. Furthermore, the ink containing the nano-sized particles can be coated to be sufficiently spread over minute irregularities of a substrate as a coating target, e.g., a copper plate. Accordingly, adhesion is greatly increased, and a stacked structure of a white insulating layer and a metal layer can be formed.

In more detail, the present invention is constituted by the following technical means.

A first aspect of the present invention relates to a semiconductor device comprising a first substrate to which a semiconductor chip is directly or indirectly mounted, and a white insulating layer formed on a surface of the first substrate and functioning as a reflecting material, wherein the semiconductor chip is an LED chip, at least the surface of the first substrate is made of a metal, and a multilayer structure of the white insulating layer and a metal layer is formed on the surface of the first substrate by coating a liquid material, which contains $SiO_2$ in form of nanoparticles and a white inorganic pigment, and by baking the coated liquid material. Herein, the first substrate is, in some cases, a module substrate to which a semiconductor package including the semiconductor chip is mounted, and in other cases, a package substrate to which the semiconductor chip is directly mounted. It is just required for the first substrate that at least the surface of the first substrate is made of a metal. Therefore, the first substrate may be of various types including a substrate having a metallic thin film layer formed on its upper surface, a substrate provided with a water-cooled structure (see Patent Document 4), and the case using, as the module substrate, a substrate that is formed by stacking heat dissipating members provided with a water-cooled structure. A package substrate having a wiring layer formed on an upper surface of an organic insulating layer is also included in the concept of the first substrate.

A second aspect of the present invention relates to a semiconductor device comprising a first substrate to which a semiconductor chip is directly or indirectly mounted, and a white insulating layer formed on a surface of the first substrate, wherein at least the surface of the first substrate is made of a metal, and a multilayer structure of the white insulating layer and a metal layer is formed on the surface of the first substrate by coating a liquid material, which contains $SiO_2$ in form of nanoparticles and a white inorganic pigment, and by baking the coated liquid material.

According to a third aspect of the present invention, in the first or second aspect, a rate of $SiO_2$ and the white inorganic pigment contained in the white insulating layer after the baking is 80% by weight or greater.

According to a fourth aspect of the present invention, in the third aspect, a rate of the white inorganic pigment contained in the white insulating layer after the baking is 40% by weight or greater, and a rate of $SiO_2$ contained therein is 25% by weight or greater. In this respect, the white inorganic pigment contains, for example, titanium dioxide having a mean particle diameter of 50 nm or smaller, and further contains titanium dioxide having a particle diameter of 25 nm or smaller.

According to a fifth aspect of the present invention, in any one of the first to fourth aspects, the white inorganic pigment is in form of particles made of titanium dioxide or zinc oxide and having surfaces coated with transparent insulating films.

According to a sixth aspect of the present invention, in any one of the first to fifth aspects, the white insulating layer is a laminated layer comprising a first layer in which zinc oxide is the white inorganic pigment, and a second layer in which titanium dioxide is the white inorganic pigment, and zinc oxide particles constituting the first layer are coated with transparent insulating films.

According to a seventh aspect of the present invention, in any one of the first to sixth aspects, the first substrate is a module substrate to which a semiconductor package including the semiconductor chip is mounted, and a wiring pattern connected to electrodes of the semiconductor package is formed on the white insulating layer.

According to an eighth aspect of the present invention, in any one of the first to sixth aspects, the first substrate is a module substrate to which a plurality of semiconductor chips are mounted, and a wiring layer connected to electrodes of the semiconductor chips is formed on an insulating layer that is formed on the surface of the first substrate.

According to a ninth aspect of the present invention, in the sixth aspect, the insulating layer positioned under the wiring layer is an organic insulating layer.

According to a tenth aspect of the present invention, in the seventh aspect, at least a part of a surface of the wiring layer is covered with the white insulating layer.

According to an eleventh aspect of the present invention, in the eighth aspect, the insulating layer positioned under the wiring layer is a white insulating layer.

According to a twelfth aspect of the present invention, in any one of the eighth to eleventh aspects, a placement portion in which the metal surface is exposed is formed at a position where the semiconductor chip is arranged.

According to a thirteenth aspect of the present invention, in the twelfth aspect, the placement portion is a projected placement portion.

According to a fourteenth aspect of the present invention, in any one of the eighth to thirteenth aspects, the plural semiconductor chips are each connected to the adjacent semiconductor chip by wire bonding.

According to a fifteenth aspect of the present invention, in any one of the seventh to fourteenth aspects, a transparent solder resist layer made of an inorganic material is formed on the first substrate.

According to a sixteenth aspect of the present invention, in any one of the first to sixth aspects, the first substrate is a package substrate including a recess in which one or plural semiconductor chips are arranged and in which the white insulating layer is formed, and the semiconductor device further comprises a second substrate including an opening into which the first substrate is fitted.

According to a seventeenth aspect of the present invention, in the sixteenth aspect, a wiring layer connected to electrodes of the semiconductor chips is formed on an organic insulating layer that is formed on a base material surface of the first substrate, and at least a part of a surface of the wiring layer is covered with the white insulating layer.

According to an eighteenth aspect of the present invention, in the sixteenth or seventeenth aspect, a placement portion in which the metal surface is exposed is formed at a position of the recess in the first substrate where the semiconductor chips are arranged.

According to a nineteenth aspect of the present invention, in the sixteenth, seventeenth or eighteenth aspect, the semiconductor device further comprises a heatsink that is contacted with respective rear surfaces of the first and second substrates.

According to a twentieth aspect of the present invention, in any one of the first to sixth aspects, the first substrate is a package substrate on which one or plural semiconductor chips are arranged, and the package substrate includes a substrate insulating layer, an upper wiring layer formed on upper side of the substrate insulating layer, and/or a lower wiring layer formed on lower side of the substrate insulating layer. Herein, the metal layer on which the white insulating layer is laminated is the upper wiring layer. The white insulating layer is encapsulated with a transparent resin, or it is covered with a lens-shaped transparent resin that contains a phosphor.

According to a twenty-first aspect of the present invention, in the twentieth aspect, the substrate insulating layer is made of glass cloth or glass unwoven fabric impregnated with a highly heat-conductive filler that is made of an inorganic material.

According to a twenty-second aspect of the present invention, in the twentieth or twenty-first aspect, respective lateral end surfaces of the substrate insulating layer and the upper wiring layer are coplanar with each other, and a lateral end surface of the lower wiring layer is positioned on inner side than the lateral end surface of the substrate insulating layer.

According to a twenty-third aspect of the present invention, in the twentieth, twenty-first or twenty-second aspect, the upper wiring layer includes an upper separation portion extending in a first direction, and the lower wiring layer includes a lower separation portion including a part extending in a second direction that is different from the first direction.

According to a twenty-fourth aspect of the present invention, in any one of the twentieth to twenty-third aspects, the upper wiring layer and the lower wiring layer are coupled to each other through a thermal via.

According to a twenty-fifth aspect of the present invention, in any one of the twentieth to twenty-fourth aspects, metallic thin film layers are disposed on respective surfaces of the upper wiring layer and the lower wiring layer.

According to a twenty-sixth aspect of the present invention, in any one of the first to twenty-fifth aspects, a thickness of the white insulating layer is 10 to 150 μm.

According to a twenty-seventh aspect of the present invention, in any one of the first to twenty-sixth aspects, the wiring is formed by coating ink containing silver particles and copper particles with drawing.

A twenty-eighth aspect of the present invention relates to a manufacturing method for a semiconductor device comprising a substrate to which an LED package is mounted, and a white insulating layer formed on a surface of the substrate, the manufacturing method comprising the steps of forming the white insulating layer on the surface of the substrate by coating a liquid material, which contains $SiO_2$ in form of nanoparticles and a white inorganic pigment, and by baking the coated liquid material, forming a wiring on the white insulating layer by coating and baking conductive metallic ink, mounting an LED chip onto the substrate, and electrically connecting the LED chip to the wiring formed on the white insulating layer.

According to a twenty-ninth aspect of the present invention, in the twenty-eighth aspect, the manufacturing method further comprises, as a step prior to the insulating layer forming step, a placement portion forming step of forming a projected placement portion on the surface of the substrate.

A thirtieth aspect of the present invention relates to a manufacturing method for a semiconductor device comprising a substrate to which an LED chip is mounted, and a white insulating layer formed on a surface of the substrate, the manufacturing method comprising the steps of fabricating the substrate by bending a metal plate to form a bottom portion in which one or plural LED chips are arranged, wall portions rising from both end sides of the bottom portion, and edge portions extending from the wall portions substantially in a horizontal direction, forming the white insulating layer on the surface of the substrate by coating a liquid material, which contains $SiO_2$ in form of nanoparticles and a white inorganic pigment, and by baking the coated liquid material, further forming a wiring on the white insulating layer by coating and baking conductive metallic ink, fixing the LED chips to the bottom portion of the substrate, and electrically connecting the LED chips to the wiring formed on the white insulating layer.

A thirty-first aspect of the present invention relates to a manufacturing method for a semiconductor device comprising a substrate to which an LED chip is mounted, and a white insulating layer formed on a surface of the substrate, the manufacturing method comprising the steps of forming, on a surface of a metal plate, a multilayer structure made up of a lower layer constituted as an organic insulating layer and an upper layer constituted as a wiring layer, further forming a separation portion that separates at least the wiring layer, fabricating the substrate by bending the metal plate to form a bottom portion in which one or plural LED chips are arranged, wall portions rising from both end sides of the bottom portion, and edge portions extending from the wall portions substantially in a horizontal direction, forming the white insulating layer on respective surfaces of the bottom portion and the wall portions of the substrate, except for regions where the LED chips are electrically connected, by coating a liquid material, which contains $SiO_2$ in form of nanoparticles and a white inorganic pigment, and by baking the coated liquid material, fixing the LED chips to the substrate, and electrically connecting the LED chips to wiring lines in the wiring layer.

According to a thirty-second aspect of the present invention, in any one of the twenty-eighth to thirty-first aspects, the liquid material containing $SiO_2$ in form of nanoparticles and the white inorganic pigment is coated by an ink jet method, a dispenser method, a spray coating method, or a screen printing method.

A thirty-third aspect of the present invention relates to a manufacturing method for a semiconductor device comprising a substrate to which one or plural LED chips or LED packages are mounted, and a white insulating layer formed on a surface of the substrate, the manufacturing method comprising the steps of forming a wiring pattern by forming a metal layer on a base material surface of the substrate with an organic insulating layer interposed therebetween, and by etching the metal layer, further etching the organic insulating layer with the wiring pattern used as a mask, forming the white insulating layer on the surface of the substrate, including at least a region where the wiring pattern is not formed, by coating a liquid material, which contains $SiO_2$ in form of nanoparticles and a white inorganic pigment, and by baking the coated liquid material, mounting the LED chips or the LED packages onto the substrate, and electrically connecting the LED chips or the LED packages to the wiring pattern.

A thirty-fourth aspect of the present invention relates to a manufacturing method for a semiconductor device comprising a substrate to which one or plural LED chips or LED packages are mounted, and a white insulating layer formed on a surface of the substrate, the manufacturing method comprising the steps of forming an upper wiring layer on upper side of a substrate insulating layer constituting a multi-unit substrate in size corresponding to many unit-size substrates, and a lower wiring layer on lower side of the substrate insulating layer, forming wiring patterns on the upper wiring layer and the lower wiring layer, providing a via that couples the upper wiring layer and the lower wiring layer to each other, forming the white insulating layer on a surface of the upper wiring layer, except for electrical connection portions, by coating a liquid material, which contains $SiO_2$ in form of nanoparticles and a white inorganic pigment, and by baking the coated liquid material, mounting many LED chips onto the multi-unit substrate, electrically connecting the LED chips to the electrical connection portions, encapsulating the multi-unit substrate with a resin at a time, and dividing the multi-unit substrate into individual unit-size substrates.

According to a thirty-fifth aspect of the present invention, in the thirty-fourth aspect, the resin has Shore D hardness of 86 or greater.

A thirty-sixth aspect of the present invention relates to a manufacturing method for a semiconductor device comprising a substrate to which one or plural semiconductor chips are mounted, the manufacturing method comprising the steps of constituting a substrate insulating layer by impregnating glass cloth or glass unwoven fabric with a highly heat-conductive filler that is made of an inorganic material, constituting the substrate by forming an upper wiring layer on upper side of the substrate insulating layer, and a lower wiring layer on lower side of the substrate insulating layer, forming wiring patterns on the upper wiring layer and the lower wiring layer, providing a via that couples the upper wiring layer and the lower wiring layer to each other, mounting the semiconductor chips onto the substrate, and electrically connecting the semiconductor chips to the upper wiring layer.

According to another point of view, the present invention is constituted by the following technical means.

[1] An LED luminescent device comprising a package substrate to which an LED chip is mounted, and a metallic thin film layer formed on a surface of the package substrate and functioning as a reflecting material, wherein the package substrate includes a substrate insulating layer, an upper wiring layer, and a lower wiring layer, the upper and lower wiring layers sandwiching the substrate insulating layer, an upper separation portion extending in a first direction is provided in the upper wiring layer, and a lower separation portion including an extension extending in a second direction, which is different from the first direction, is provided in the lower wiring layer.

[2] The LED luminescent device defined in [1], wherein respective lateral end surfaces of the substrate insulating layer and the upper wiring layer are coplanar with each other, and a lateral end surface of the lower wiring layer is positioned on inner side than the lateral end surface of the substrate insulating layer.

[3] The LED luminescent device defined in [1] or [2], wherein the upper separation portion and the lower separation portion extend perpendicularly to each other.

[4] The LED luminescent device defined in any one of [1] to [3], wherein the upper wiring layer is covered with a coating layer of an inorganic material.

[5] The LED luminescent device defined in [4], wherein the coating layer of the inorganic material is formed by coating a liquid material, which contains $SiO_2$ in form of nanoparticles and a white inorganic pigment, and by baking the coated liquid material.

Advantageous Effects of Invention

With the present invention, since the layer in which almost all of components are made of inorganic materials can be formed on the substrate, the semiconductor device can be provided which includes the electrical insulating layer with superior heat resistance, heat dissipation, and durability.

Furthermore, since the electrical insulating layer serves as a reflecting material, an expensive reflecting material is no longer required even when the semiconductor chip is an LED. In addition, an additional process for forming a reflecting layer is also no longer required.

Moreover, since the white insulating layer is formed on the substrate surface by coating the liquid material, which contains $SiO_2$ in the form of nanoparticles and the white inorganic pigment, and by baking the coated liquid material, the white insulating layer having a desired shape and thickness can be formed at a desired position on the substrate.

BRIEF DESCRIPTION OF THE DRAWINGS

FIG. 1 is a side sectional view illustrating a first configuration example of an LED illumination module embodying the present invention.

FIG. 2 is a side sectional view illustrating a second configuration example of the LED illumination module embodying the present invention.

FIG. 3 is an illustration to explain manufacturing of an LED package substrate that is formed by pressing using a metal die; specifically, FIG. 3(a) is a side sectional view illustrating a metal plate before the pressing, FIG. 3(b) is a side sectional view illustrating the metal plate having being bent into a predetermined shape including a recess, FIG. 3(c) is a side sectional view illustrating the metal plate on a surface of which a white insulating layer is formed, and FIG. 3(d) is a side sectional view illustrating the metal plate on which a wiring is formed with drawing at necessary locations on the white insulating layer.

FIG. 4 is an illustration to explain assembly of the second configuration example of the LED illumination module embodying the present invention; specifically, FIG. 4(a) is a side sectional view illustrating fixing of an LED package, FIG. 4(b) is a side view illustrating electrical connection, and FIG. 4(c) is a side sectional view illustrating fixing of a heatsink.

FIG. 5 is an illustration to explain assembly of a third example of the LED illumination module embodying the present invention.

FIG. 6 is s side sectional view illustrating a fourth configuration example of the LED illumination module embodying the present invention.

FIG. 7 illustrates a module substrate embodying the present invention; specifically, FIG. 7(a) is a plan view of the module substrate before the LED package is mounted in the second configuration example, and FIG. 7(b) is a plan view of the module substrate before the LED package is mounted in the fourth configuration example.

FIG. 8 is an illustration to explain a fifth configuration example of the LED illumination module embodying the present invention; specifically, FIG. 8(a) is a side sectional view illustrating a first mounting method for an LED chip, FIG. 8(b) is a side sectional view illustrating a second mounting method for the LED chip, and FIG. 8(c) is a side sectional view illustrating a third mounting method for the LED chip.

FIG. 9 is a side sectional view to explain manufacturing steps of a substrate used in the fifth configuration example of the LED illumination module embodying the present invention.

FIG. 10 is a side sectional view illustrating a sixth configuration example of the LED illumination module embodying the present invention.

FIG. 11 is a side sectional view illustrating an LED package according to a seventh configuration example embodying the present invention.

FIG. 12 is a perspective view to explain a dicing method for the LED package according to the seventh configuration example.

FIG. 13 illustrates a modification in which the LED package according to the seventh configuration example includes a placement portion; specifically, FIG. 13(a) is a side sectional view, FIG. 13(b) is a seeing-through perspective view of main components, and FIG. 13(c) is a plan view.

FIG. 14 illustrates a modification in which the LED package according to the seventh configuration example is flip-chip mounted; specifically, FIG. 14(a) is a side sectional view, FIG. 14(b) is a seeing-through perspective view of main components, and FIG. 14(c) is a plan view.

FIG. 15 illustrates a modification in which a phosphor is disposed on an upper surface of an LED chip in the LED package of FIG. 14; specifically, FIG. 15(a) is a side sectional view, FIG. 15(b) is a seeing-through perspective view of main components, and FIG. 15(c) is a plan view.

FIG. 16 illustrates an eighth configuration example of the LED package; specifically, FIG. 16(a) is a side sectional view, FIG. 16(b) is a seeing-through perspective view of main components, and FIG. 16(c) is a plan view (in which a silver plating layer is omitted).

FIG. 17 illustrates a modification in which a separation portion has a bent shape in the LED package of FIG. 16.

FIG. 18 is a side sectional view illustrating an LED package according to a ninth configuration example embodying the present invention.

FIG. 19 is a side sectional view illustrating a power semiconductor package according to a tenth configuration example embodying the present invention.

FIG. 20 is a side sectional view illustrating an LED package according to an eleventh configuration example embodying the present invention.

FIG. 21 is a top plan view illustrating the LED package according to the eleventh configuration example embodying the present invention.

FIG. 22 is a side sectional view illustrating an LED package according to a twelfth configuration example embodying the present invention.

FIG. 23 is a side sectional view illustrating an LED package according to a thirteenth configuration example embodying the present invention.

FIG. 24 illustrates an LED package disclosed in Patent Document 3: specifically, FIG. 24(A) is a side sectional view of a central portion of the package, and FIG. 24(B) is a plan view of the central portion.

FIG. 25 is a side sectional view illustrating an illumination fixture disclosed in Patent Document 1.

MODE FOR CARRYING OUT THE INVENTION

The present invention will be described below in connection with exemplary embodiments. FIG. 1 is a side sectional view illustrating a first configuration example of an LED illumination module embodying the present invention. An LED illumination module 11 of FIG. 1 includes, as main components, a known LED package 1, and a module substrate 12 on which a wiring 13 and a white insulating layer 14 are formed.

The LED package 1 is constituted by fixing and electrically connecting an LED chip 3 to a package substrate 2, and then encapsulating the LED chip 3 with a transparent resin 5 (e.g., an epoxy-based or silicone-based resin). The LED package 1 is mounted such that electrodes disposed on the backside of the package substrate 2 are connected to the wiring 13 formed on the module substrate 12 by soldering, for example. A luminescent surface of the LED chip 3 faces upwards as viewed in FIG. 1, and emits light upwards without being blocked by the package substrate 2.

While FIG. 1 illustrates an embodiment in which one LED chip 3 is arranged in one LED package 1, it is of course possible to arrange a plurality of LED chips 3 in the one LED package 1.

The module substrate 12 is made of a material having good thermal conductivity and electrical characteristics, e.g., a copper plate or an aluminum plate. The module substrate 12 may include a water-cooled structure (e.g., a heat pipe in which a circulation flow is generated with the capillary phenomenon in a liquid chamber that is formed by stacking thin copper plates each having a plurality of minute openings, and by closing the upper and lower sides of the stacked assembly with copper plates (see Patent Document 4)). Alternatively, the module substrate 12 may be constituted by stacking heat dissipating members provided with a water-cooled structure.

A white insulating layer 14 serving also as a reflecting material is disposed on a surface of the module substrate 12. A mean reflectance of the white insulating layer 14 in a wavelength range of visible light is preferably 70% or greater and more preferably 80% or greater. The white insulating layer 14 contains, as main components, white inorganic powder (white inorganic pigment) and silicon dioxide ($SiO_2$). The white insulating layer 14 is formed by coating and baking ink (hereinafter referred to as "white inorganic ink" in some cases), which is prepared by mixing the white inorganic powder and the silicon dioxide with each other by employing, as a solvent, diethylene glycol monobutyl ether that contains organic phosphoric acid. Here, the white inorganic ink is coated by, e.g., the ink jet method, the dispenser method, the spray coating method, or the screen printing method. A thickness of the white insulating layer 14 is preferably as thin as possible from the viewpoint of heat dissipation characteristics, but a certain thickness is required from the viewpoint of withstanding voltage and tearing strength. The withstanding voltage of an insulating film required for mounting of the LED is generally 1.5 to 5 kV, whereas the white inorganic insulator has the withstanding voltage of about 1 kV/10 μm though depending on a mixing ratio of the white inorganic powder and the silicon dioxide. Therefore, the thickness is preferably set to 15 μm or greater. On the other hand, the thickness of the white insulating layer 14 is preferably set to a certain value or less in order to avoid reduction of heat dissipation performance caused by the presence of the white insulating layer 14. Thus, the thickness of the white insulating layer 14 is set to, e.g., the range of 10 to 150 μm, preferably the range of 15 to 100 μm, more preferably the range of 25 to 70 μm, even more preferably the range of 30 to 60 μm, still even more preferably the range of 40 to 60 μm, and most preferably the range of 40 to 50 μm.

The wiring 13 is formed at necessary locations on the white insulating layer 14. The wiring 13 may be formed through steps of forming a metal layer by, e.g., vapor deposition or sputtering, coating a resist on the metal layer, exposing a pattern to the resist, developing and etching the pattern, and then removing the resist. However, the wiring 13 is preferably formed through the steps of coating conductive metallic ink (e.g., silver ink or hybrid ink in which silver and copper are mixed) at the necessary locations with drawing using the ink jet method or the dispenser method, and then baking the coated conductive metallic ink into a metallized state. When the surface of the white insulating layer 14 is water-repellent, the connection wiring is formed after removing water-repellent residues to promote surface activation with a plasma process, for example, and, if required, after further performing a primer process (using, e.g., an epoxy primer) to increase adhesion between materials.

The conductive metallic ink preferably contains metallic nanoparticles as a functional material. It is known, for example, that although the melting point of silver (Ag) is 961.9° C., the melting point starts to fall at the silver particle size of about 100 nm, and falls down to 200 to 250° C. at the size of 10 nm or smaller. Accordingly, when the wiring is formed using the metallic nanoparticles, the conductive metallic ink containing the metallic nanoparticles has a sufficiently low melting point, and it can be applied to even device components, such as an organic film or a plastic substrate, using materials that require low-temperature baking.

When the wiring is formed using the metallic nanoparticles, the hybrid ink containing silver and copper is preferably used. If soldering is performed on a silver wiring, silver is caught into a solder (namely, silver is diffused into a molten solder), thus causing a problem with reliability, such as disconnection of the silver wiring or formation of a silver-rich solder. By using the hybrid ink of silver and copper, a copper-rich portion of the hybrid ink and the solder are jointed to form an interface alloy, and the diffusion of silver into the solder can be suppressed.

A solder resist layer 15 made of a transparent inorganic material is disposed, as required, on the module substrate 12. A transparent film constituting the solder resist layer 15 can be made of, e.g., silicon dioxide ($SiO_2$). The solder resist layer 15 is formed by coating a sol (liquid coating agent) containing $SiO_2$ (mean particle diameter: 50 nm or smaller), or a solution containing polysilazane at necessary locations by the ink jet method or the dispenser method, and then baking the coated sol or solution.

Main features of the white insulating layer in the present invention are as follows:

A first feature is that 80% by weight or greater (preferably 85% by weight or greater, more preferably 90% by weight or greater, and even more preferably 95% by weight or greater) of the formed white insulating layer is made of an inorganic material. For example, when the ink containing 90% by weight or greater of the inorganic material is coated and baked, an insulating layer in which an organic material is hardly present can be formed.

A second feature is that the silicon dioxide ($SiO_2$) constituting the inorganic material is in the form of nanoparticles. Here, the particle diameter of the white inorganic powder constituting the inorganic material is preferably 1 μm or smaller. More preferably, the white inorganic powder constituting the inorganic material is also in the form of nanoparticles. By employing the ink in which at least $SiO_2$ is in the form of nanoparticles, it becomes possible to coat a liquid material (white inorganic ink) made of 80% by weight or greater of the inorganic material, the liquid material having been so far difficult to coat it. Moreover, because the particle diameter is sufficiently smaller than the wavelength of light, reflectance increases. In this description, the term "nanoparticles" implies particles having diameters of several nm to several hundreds nm. A mean particle diameter of $SiO_2$ used here is preferably 50 nm or smaller. More preferably, the $SiO_2$ further contains particles having diameters of 20 nm or smaller. Even more preferably, the $SiO_2$ further contains particles having diameters of 10 nm or smaller. The content of $SiO_2$ in the formed white insulating layer is preferably 25% by weight or greater, and more preferably 30 to 40% by weight.

The white inorganic pigment is made of, e.g., titanium dioxide, zinc oxide, alumina, or a combination of two or more selected from the formers. The content of the white inorganic pigment in the formed white insulating layer is adjusted as appropriate depending on the required reflectance, etc., but it is preferably 40 to 70% by weight and more preferably 50 to 65% by weight. The reason is that a sufficient reflection effect can be obtained by setting the content of the white inorganic pigment to 40% by weight or greater, and that ink fluidity required to form a uniform film can be ensured by setting the content of the white inorganic pigment to 70% by weight or smaller.

A mean particle diameter of the white inorganic powder used here is preferably 50 nm or smaller. More preferably, the white inorganic powder further contains particles having diameters of 25 nm or smaller. The white inorganic powder thus prepared in the form of nanoparticles can be suitably coated by the ink jet method, the dispenser method, or the spray coating method.

The white inorganic powder may be coated with a transparent insulating film over the particle surface. The transparent insulating film may be, for example, an alumina coating or a silica coating. Of those examples, the alumina coating is preferably used from the viewpoint of thermal conductivity. A mean particle diameter of the white inorganic particles coated with the transparent insulating films is, e.g., 10 nm to 5 μm (preferably 1 μm or smaller), and a thickness of the coating film is 10 to 50 nm. It is also expectable that the problem with deterioration of the transparent resin in the LED, caused by the catalytic effect of titanium dioxide, can be reduced by coating the white inorganic particles with the transparent insulating films.

To increase the heat dissipation performance of the white insulating layer, the above-described liquid material (white inorganic ink) may be mixed with a highly heat-conductive filler made of an inorganic material (e.g., a filler obtained by coating silicon carbide (SiC) with an alumina film having a nm-order size). For example, thermal conductivity of SiC is about 160 w/m·k, i.e., about 20 times that of titanium dioxide ($TiO_2$). By increasing a rate of the highly heat-conductive filler, the heat dissipation performance is enhanced, but the reflectance is reduced. Therefore, the highly heat-conductive filler is mixed at a rate of 1 to 30, preferably 5 to 20, and more preferably 5 to 15 with respect to weight 100 of the white inorganic pigment.

By coating the white inorganic ink made of the above-mentioned insulating material on a metal plate and heating them to 160 to 200° C., for example, the nano-size insulating particles dispersed in the solvent are arrayed following irregularities of the substrate surface, and the solvent is evaporated, whereby a dense white insulating layer (film) is formed. Stated in another way, the nano-size ceramic mixed powder is held in direct contact with the metal surface and is heated in the atmosphere to be sintered there. As a result, a multilayer structure made up of the white inorganic layer and the metal layer is formed through metal surface joining that is developed at a joining interface with utilization of a diffused state based on the nano-size effect. Thus, according to the present invention, the white insulating layer having the desired shape and thickness can be formed at the desired position on the substrate because the insulating material of the white insulating layer is in an ink-like state. According to the present invention, for example, after forming a recess in the substrate surface, the white insulating layer can be coated on a region of the substrate surface except for a mount region for the LED chip 3.

With the LED illumination module of the present invention, since the white insulating layer 14 functions as the reflecting material, the necessity of additionally providing an expensive reflecting material can be eliminated, and the material cost can be reduced to a large extent. Furthermore, the above-described process can be said as being superior in cost performance because a step of forming the reflecting material can be omitted. Trial calculation shows, for example, that the material cost can be cut to about ½ in units of package as compared with the case using a silver plating as the reflecting material. Thus, an even greater cost-reduction effect is expected in units of illumination module. Moreover, since the insulating layer made of the white inorganic material has higher thermal conductivity about one order than that of glass epoxy, for example, higher heat dissipation performance is obtained. Trial calculation shows that the insulating layer made of the white inorganic material has higher heat dissipation performance two to five times than that of a PLCC (plastic leaded chip carrier) having a similar configuration. In addition, by coating the metal surface of the substrate with the white insulating layer 14, a sulfidizing phenomenon can be suppressed.

FIG. 2 is a side sectional view illustrating a second configuration example of the LED illumination module embodying the present invention. The LED illumination module 11 of FIG. 2 includes, as main components, a plurality of LED packages 1, a module substrate 12, and a heatsink 29.

The LED packages 1 are each constituted by forming a white insulating layer 24 on a surface of the package substrate 2 including a recess 22 that has a gradually increasing diameter, forming a wiring 23 on the white insulating layer 24 with drawing, and then encapsulating the wiring 23 and the LED chip 3 with a resin after wire-bonding them.

The module substrate 12 is made of a material (e.g., a copper plate or an aluminum plate) having good thermal conductivity and electrical characteristics, and it includes an opening 17 into which the package substrate 2 is fitted. A white insulating layer 14 is formed on a surface of the module substrate 12, and a pattern of wiring 13 is formed on the white insulating layer 14. The LED package 1 is attached to the module substrate 12 by filling gaps between lateral surfaces of the LED package 1 fitted into the opening 17 and the module substrate 12 with an adhesive (heat-resistant adhesive) 18, and by connecting, over the adhesive 18, a pair of connection electrodes (external connection electrodes for connection to the module substrate) 26 to the wiring 13 above the module substrate 12 by soldering, for example. A rear surface of the LED package 1 (specifically, the package substrate 2) mounted to the module substrate 12 is arranged in contact with an upper surface of the heatsink 29. Here, the rear surface of the package substrate 2 is preferably fixed to the heatsink 29 with a highly heat-conductive adhesive or by soldering, for example, such that the rear surface of the package substrate 2 will not depart from the heatsink 29 due to, e.g., deformations of various plate materials. Similarly, the rear surface of the module substrate 12 is also preferably fixed to the heatsink 29 with a highly heat-conductive adhesive or by soldering, for example. The heatsink 29 may include a water-cooled structure (e.g., the structure disclosed in Patent Document 4), or it may be constituted by stacking heat dissipating members provided with a water-cooled structure. Alternatively, the module substrate 12 can also be itself utilized as a heat dissipating body instead of the heatsink 29. When the module substrate 12 is itself utilized as the heat dissipating body, the module substrate 12 is not required to include the openings, and the LED package 1 is mounted to the upper surface of the module substrate 12 (see FIG. 6 described later).

FIG. 3 is an illustration to explain a bending process of a metal plate 21 constituting the package substrate 2. FIG. 3(a) is a side view illustrating the metal plate (i.e., a plate-like metallic member made of, e.g., copper or aluminum and having high thermal conductivity) before the bending. As illustrated in FIG. 3(b), the metal plate 21 is bent into a predetermined shape including a recess 22 in which the LED chip 3 is to be mounted. More specifically, the metal plate 21 is bent by pressing using a metal die so as to form the recess 22 in which the LED chip 3 is to be mounted, and flat edge portions 25 extending substantially in the horizontal direction, which are formed by bending upper end portions outwards after forming the recess 22. Next, as illustrated in FIG. 3(c), the white insulating layer 24 is formed on a surface of the metal plate 21 having been bent into the predetermined shape. The white insulating layer 24 is formed over the entire surface of the metal plate 21 including the recess 22 and the edge portions 25. Because the white insulating layer 24 contains $SiO_2$ at a certain percentage or more and tends to easily fracture during the pressing, it needs to be formed after the pressing of the metal plate. The white insulating layer 24 is formed by the ink jet method, the dispenser method, or the spray coating method for the reason that screen printing cannot be applied due to unevenness caused after the pressing. A white inorganic pigment used here is preferably titanium dioxide having a mean particle diameter of 50 nm or smaller. More preferably, the white inorganic pigment further contains titanium dioxide having a particle diameter of 25 nm or smaller.

Next, as illustrated in FIG. 3(d), a wiring 23 is formed with drawing at necessary locations on the white insulating layer 24. The wiring 23 is formed by coating the conductive metallic ink with drawing using the ink jet method or the dispenser method, and then baking the coated conductive metallic ink into a metallized state. A pair of opposing connection electrodes (external connection electrodes) 26 are formed on the edge portions 25. At that time, a wiring not-formed portion 27 where the white insulating layer 24 is exposed is disposed at respective ends of the edge portions 25 to prevent solders from causing electrical short-circuiting between the connections electrodes 26 and the metal plate 21. The wiring 23 is formed with drawing in a pattern having a separation portion 28 to ensure isolation between the pair of connection electrodes 26.

Walls may be raised from right, left, front and rear ends of a bottom portion of the recess 22 in any desired shape or angle. For example, the walls may be raised obliquely upwards in a linear or curved shape such that the connection electrodes 26 can be positioned at a level above the bottom portion, which is in the form of a flat plate.

The LED chip 3 is mounted in the recess 22 of the package substrate 2 constituted as described above, and is fixed by employing a die bonding material. Then, individual lines of the wiring 23 connected to the pair of connection electrodes 26, which are divided into the right and left sides, are connected to the LED chip 3 for electrical connection by wire bonding. Thereafter, the transparent resin 5 is filled. A phosphor may be mixed in the transparent resin 5. Generally, in the case of a white LED, a blue-light emitting LED chip is employed, and a yellow phosphor is disposed on the LED chip. The yellow phosphor emits white light upon receiving blue light. In usual cases, such a phosphor is mixed in the transparent resin. The resin encapsulation is performed by arranging the packages, which are in an interconnected state, into a metal mold. As an alternative, the resin encapsulation may be performed by employing a dispenser or with screen printing. The resin is filled until the height of the encapsulating resin becomes flush with uppermost surfaces of the walls serving as places where the connection electrodes 26 are formed. The LED package 1 is then completed by dividing the interconnected packages into individual packages or individual sets of interconnected packages.

It is to be noted that, while the procedures not performing a primer coating process have been described with reference to FIG. 3, the step (d) may be carried out after performing the primer coating process subsequent to step (c). Furthermore, a recessed placement portion 16 where the wiring 23 and the white insulating layer 24 are not formed and the metal plate 21 is exposed, or a later-described projected placement portion 47 may be provided, and an LED chip 3 insulated at its rear surface may be arranged in the recessed placement portion 16 or on the projected placement portion 47 and then fixed there by employing a heat-conductive adhesive (see FIGS. 5, 6 and 20 described later).

FIG. 3 may be modified as follows. A multilayer structure made up of a lower layer constituted as an organic insulating layer and an upper layer constituted as a wiring layer are formed on the surface of the recess 22. The separation portion 28 is further formed to separate at least the wiring layer. The white insulating layer 24 is then formed by coating a liquid material, which contains $SiO_2$ in the form of nanoparticles and a white inorganic pigment, over a bottom surface (except for regions where the LED chip is electrically connected) and sloped surfaces (wall surfaces), both the bottom and wall surfaces serving as reflecting surfaces, and by baking the coated liquid material. The multilayer structure made up of the lower layer constituted as the organic insulating layer and the upper layer constituted as the wiring layer may be realized by press-bonding a multilayer member, which comprises a resin layer (e.g., a polyimide film) and a metal foil (e.g., a copper foil), with an adhesive under high temperature and pressure.

FIG. 4 is a side sectional view to explain assembly of the second configuration example of the LED illumination module embodying the present invention.

First, as illustrated in FIG. 4(a), the LED package 1 is fitted into the opening 17 of the module substrate 12. A rear surface of the edge portion 25 and a front surface of the module substrate 12 may be fixed to each other with, e.g., a highly heat-conductive adhesive. Then, as illustrated in FIG. 4(b), spaces between the edge portions 25 of the LED package 1 and the wiring 13 on the module substrate 12 are filled with the insulating adhesive 18, and electrical connection portions 19 made of, e.g., a solder are formed on the insulating adhesive 18 to electrically connect the pair of connection electrodes (external connection electrodes) 26 to the wiring 13 on the module substrate 12. Finally, as illustrated in FIG. 4(c), respective rear surfaces of the package substrate 2 and the module substrate 12 are contacted with and fixed to a front surface of the heatsink 29. If the rear surfaces of the package substrate 2 and the module substrate 12 are spaced from the front surface of the heatsink 29, the heat dissipation effect reduces. Therefore, the rear surfaces of both the substrates 2 and 12 are preferably fixed to the front surface of the heatsink 29 with a highly heat-conductive adhesive or by soldering, for example.

According to the second configuration example constituted as described above, since heat generated from the LED chip 3 is dissipated from the heatsink 29 through the package substrate 2 and the module substrate 12, it is possible to eliminate restrictions on the luminescence intensity and the integration degree of the LED chip 3.

FIG. 5 is a side sectional view illustrating a third configuration example of the LED illumination module embodying the present invention. The LED illumination module 11 of FIG. 5 includes, as main components, the LED package 1, the module substrate 12, and the heatsink 29.

The package substrate 2 is made of a material (e.g., a copper plate or an aluminum plate) having good thermal conductivity and electrical characteristics, and a recessed placement portion 16 not including the white insulating layer 14 is formed. In the third configuration example, since the LED chip 3 insulated at its rear surface is mounted in the placement portion 16 where the white insulating layer 14 is not disposed, the heat dissipation performance from the rear surface of the LED chip 3 is increased. It is to be noted that a projected placement portion 47 described later in a tenth configuration example may be provided instead of the placement portion 16.

Furthermore, the third configuration example is premised on that any desired wiring substrate is employed as the module substrate 12. For example, the wiring substrate is constituted by a single-layer glass epoxy substrate. The module substrate 12 includes the wiring 13 and the opening 17 into which the package substrate 2 is fitted. The white insulating layer 24 serving as not only a reflecting material, but also a solder resist layer may be formed on the surface of the module substrate 12. The LED package 1 is mounted to the module substrate 12 by filling gaps between lateral surfaces of the LED package 1, which has been fitted into the opening 17, and the module substrate 12 with the adhesive (heat-resistant adhesive) 18, and by connecting, over the adhesive 18, the pair of connection electrodes (external connection electrodes for connection to the module substrate) 26 to the wiring 13 on the upper surface of the module substrate 12 by soldering, for example. The rear surface of the LED package 1 (specifically, the package substrate 2) mounted to the module substrate 12 is fixed to the upper surface of the heatsink 29 with the highly heat-conductive adhesive 20 or by soldering. The heatsink 29 may be constituted as a substrate including a water-cooled structure (e.g., the substrate disclosed in Patent Document 4), or it may be constituted as a substrate that is formed by stacking heat dissipating members provided with a water-cooled structure.

The above-described heat dissipation structure of the third configuration example is suitable for a semiconductor chip, including an LED chip, which generates a large amount of heat. A semiconductor device may be constituted, for example, by replacing the LED chip with a power semiconductor chip.

FIG. 6 is a side sectional view to explain a fourth configuration example of the LED illumination module embodying the present invention. The LED illumination module 11 of FIG. 6 is constituted by mounting, onto the module substrate 12, a plurality of LED packages 1 each having electrodes on its upper surface.

The LED package 1 is constituted by arranging the LED chip 3 directly in the recessed placement portion 16 on the package substrate 2, and by fixing the LED chip 3 there with a heat-conductive adhesive (for example, mixed with a heat-conductive filler made of a ceramic, e.g., aluminum nitride, or a metal). The white insulating layer 24 is formed on the entire surface of the package substrate 2 except for the placement portion 16, and the wiring 23 is disposed at necessary locations on the white insulating layer 24. The LED package 1 is encapsulated with the transparent resin 5 after electrically connecting the LED chip 3 and the wiring 23 to each other. The encapsulation with the transparent resin 5 is performed so as to cover only the LED chip 3, the wiring 23 in the vicinity of the LED chip 3, and the white insulating layer 24, and the wiring 23 at both exposed ends of the LED package constitutes the connection electrodes 26. Both end portions of the package substrate 2 are covered with the insulating adhesives 18 in a way of bridging the connection electrodes 26 on the package substrate between the wiring 13 on the module substrate. The electrical connection portions 19 interconnecting the connection electrodes 26 on the package substrate and the wiring 13 on the module substrate are disposed over the insulating adhesives 18. The electrical connection portions 19 are formed by coating conductive metallic ink (e.g., hybrid ink in which silver and copper are mixed) with drawing using the ink jet method or the dispenser method, and then baking the coated conductive metallic ink into a metallized state. Also in the fourth example, the solder resist layer 15 may be formed on the package substrate as required.

FIG. 7(a) is a plan view of the module substrate before the LED package is mounted in the second configuration example, and FIG. 7(b) is a plan view of the module substrate before the LED package is mounted in the fourth configuration example.

The module substrate 12 of FIG. 7(a) includes a plurality of openings 17 into which the LED packages 1 are mounted. The openings 17 are formed by, e.g., die cutting (punching). The wiring 13 is formed by, e.g., coating with drawing before or after forming the openings 17.

In the module substrate 12 of FIG. 7(b), the openings 17 are not formed because the LED packages 1 are arranged directly on the module substrate 12.

In any of the cases using the module substrates 12 of FIGS. 7(a) and 7(b), the LED illumination module 11 is manufactured by, after mounting the LED packages 1 into the openings 17, electrically connecting the connection electrodes 26 of the LED packages 1 to the wiring 13.

FIG. 8 is a side sectional view to explain a fifth configuration example of the LED illumination module embodying the present invention.

The LED illumination module 11 of FIG. 8(a) is mounted in the face-down state by connecting electrodes (e.g., stud bumps), which are provided on the surface (lower surface) of the LED chip 3, to the wiring 13 formed on the module substrate 12 by soldering, for example. Such mounting is called the flip chip mounting. With the flip chip mounting, the chip front surface is positioned on the lower side because the chip is mounted in the face-down state. It is to be noted that, with the flip chip mounting, because the chip is connected to the wiring through the bumps, a small gap is formed between the chip and the substrate, and underfilling with resin, for example, is required to fill the gap in some cases. In this application, however, such an underfiller is omitted from the drawing. A base material of the module substrate 12 is a material having good thermal conductivity and electrical characteristics, and it is a copper plate or an aluminum plate, for example. The wiring 13 is formed on an organic insulating layer 30 that is made of a known organic material (e.g., polyimide). The above-described white insulating layer 14 is formed as a coating over a base material surface of the module substrate 12 in regions where the wiring 13 and the organic insulating layer 30 are not provided. Regions of the lower surface of the LED chip 3, which are not contacted with the wiring 13, are contacted with the white insulating layer 14 directly or through the underfiller. Thus, heat is dissipated from the module substrate 12 through the white insulating layer 14. The transparent resin 5 is formed by filling a transparent resin into a removable frame mold or a fixed surrounding member.

The LED illumination module 11 of FIG. 8(b) is face-down (flip-chip) mounted by connecting salient electrodes (bumps), which are provided on the lower surface of the LED chip 3, to the wiring 13 formed on the module substrate 12 through electrical connection portions 31. The module substrate 12 and the wiring 13 have the same configurations as those in FIG. 8(a). In the form of FIG. 8(b), the white insulating layer 14 is formed as a coating directly or indirectly covering the entire upper surface of the module substrate 12 except for openings where the electrical connection portions 31 are formed. The opening for each of the electrical connection portions 31 has a size of, e.g., 50 to 500 μm square. Also in the form of FIG. 8(b), regions of the lower surface of the LED chip 3 except for the electrical connection portions 31 are contacted with the white insulating layer 14 directly or through the underfiller.

In the LED illumination module 11 of FIG. 8(c), the LED chip 3 and the wiring 13 are connected to each other by wire bonding. The module substrate 12, the wiring 13, and the white insulating layer 14 have the same configurations as those in FIG. 8(a). The rear surface (lower surface) of the LED chip 3 is fixed to the upper surface of the module substrate 12 with a highly heat-conductive adhesive, for example.

FIG. 9 is a side sectional view to explain manufacturing steps of the substrate used in the fifth configuration example of the LED illumination module embodying the present invention.

First, an organic insulating layer (e.g., a polyimide layer) and a copper foil layer are formed on a substrate (STEP 1). For example, those layers are formed by stacking a thermoplastic polyimide film and a copper foil on a metal plate, and by applying high temperature and high pressure (e.g., at 350° C. for 20 minutes) to them.

Next, the affixed copper foil is subjected to patterning (STEP 2). The patterning is performed using photolithography, for example. A resist is coated over the copper foil. Copper-foil removed portions are formed by exposing a pattern to the coated resist, developing and etching the pattern, and then removing the resist.

Next, the organic insulating layer is etched with the copper foil used as a mask (STEP 3). For example, an amine-based solution is usually employed as a solution for etching polyimide.

Finally, a white inorganic material is coated so as to fill the copper-foil removed portions on the module substrate 12 (STEP 4). Here, the white inorganic material is coated in different ways depending on the desired form (see FIG. 8) of the LED module. In STEP 4, (a) represents the case where the white inorganic material is coated up to a height that is substantially flush with the wiring, and (b) represents the case where the white inorganic material is coated in a state partly overlapping with the wiring except for the openings for electrical connection. In the case of (b), the white inorganic material can be coated by screen printing as one example. Other examples include a method of coating the white inorganic material over the entire surface including the wiring, and then forming openings by a laser, and a two-stage coating method of coating the white inorganic material up to the same height as the wiring by printing or using a dispenser, and then coating the white inorganic material over regions of the wiring except for the openings by printing (screen printing or flexo printing) or using a dispenser.

FIG. 10 is a side sectional view illustrating a sixth configuration example of the LED illumination module embodying the present invention. The LED illumination module 11 of the sixth configuration example is different from (a) of the fifth configuration example in that the white insulating layer includes a lower layer denoted by 14a and an upper layer denoted by 14b. In the following, the same points as those in (a) of the fifth configuration example are omitted, and only different points are described. It is needless to say that the white insulating layers 14a and 14b in the sixth configuration example can be applied to (b) and (c) of the fifth configuration example as well.

The white insulating layer 14a is a layer in which zinc oxide is used as the white inorganic pigment, and the white insulating layer 14b is a layer in which titanium dioxide is used as the white inorganic pigment. Zinc oxide particles constituting the lower layer 14a of the white insulating layer are coated with transparent insulating films (e.g., alumna films) and have a mean particle diameter of 1 µm or smaller. Titanium dioxide particles constituting the upper layer 14b of the white insulating layer are nano-sized particles or particles coated with transparent insulating films (e.g., alumna films) and having a mean particle diameter of 1 µm or smaller.

The reason why the white insulating layer is formed in the above-described multilayer structure resides in anticipating a possibility that a satisfactory reflectance cannot be obtained with only a layer containing zinc oxide as the white inorganic pigment, while utilizing characteristics of zinc oxide, i.e., good thermal conductivity. In other words, the white insulating layer having characteristics of low heat resistance and high reflectance can be obtained by constituting the lower layer 14a as an insulating layer in which zinc oxide is used as the white inorganic pigment, and the upper layer 14b as an insulating layer in which titanium dioxide having high reflectance is used as the white inorganic pigment. In this respect, the zinc oxide particles have to be coated with the transparent insulating films, whereas the titanium dioxide particles may be coated or may not be coated with the transparent insulating films. As the white inorganic material having good thermal conductivity and used to constitute the multilayer structure, magnesium oxide or another white inorganic material having higher thermal conductivity than titanium dioxide may be used instead of the zinc oxide particles.

It is to be noted that, although thicknesses of the lower layer 14a and the organic insulating layer 30 and thicknesses of the upper layer 14b and the wiring 13 are illustrated as being equal to each other in FIG. 10, respectively, a thickness relation is not limited to the illustrated one and the thicknesses of the lower layer 14a and the upper layer 14b are determined as appropriate from the viewpoint of the thermal conductivity, the reflection performance, and the insulation performance.

FIG. 11 is a side sectional view illustrating an LED package according to a seventh configuration example embodying the present invention.

The manufacturing cost of the LED package 1 having the configuration illustrated in FIG. 1 can be reduced by employing the so-called MAP (Mold Array Package) production method of encapsulating a plurality of LED packages at a time. However, the LED package 1 of FIG. 1 has the problem that the package substrate 2 is apt to drop off because the package substrate 2 is separated by separation portions 28a and 28b.

Recently, a CSP (Chip Size Package) has been required in response to demands for further reduction in size and weight of electronic devices. In the LED package 1 having the configuration illustrated in FIG. 1, however, an area of the package substrate needs to be kept at a certain value or more to ensure sufficient mechanical strength, and it is difficult to realize the CSP. In the case using a ceramic substrate, the mechanical strength is increased, but a difficulty arises in realizing a low cost and high heat dissipation. The seventh configuration example discloses a surface-mounted LED package 1 having a structure that enables the LED package 1 to be manufactured by the MAP method and that does not cause the problem of drop-off even when the area of the package substrate 2 is set to the certain value or less.

The package substrate 2 to which the LED package 1 according to the seventh configuration example is mounted includes an organic insulating layer 30, wiring layers 32a and 32b sandwiching the organic insulating layer 30, a via 33 connecting the wiring layers 32a and 32b to each other, and a cutout 34.

The organic insulating layer 30 can be made of one or more resins selected from among polyimide-based resins, olefin-based resins, polyester-based resins, and mixtures or modified resins of the formers. A thickness of the organic insulating layer 30 is determined in view of balance between insulation performance and thermal conductivity, and it is 10 to 60 µm, preferably 10 to 30 µm, for example, when the above-mentioned resins are used.

It is to be noted that the organic insulating layer 30 may be replaced with a substrate insulating layer 42 described later in a ninth configuration example.

The polyimide-based resins include, for example, polyimide, polyamide imide, and polyester imide each having an imide ring structure.

The olefin-based resins include, for example, polyethylene, polypropylene, polyisobutylene, polybutadiene, polyisoprene, cycloolefin-based resins, and copolymers of the formers.

The polyester-based resins include, for example, polyethylene terephthalate, polybuhylene terephthalate, polyethylene naphthalate, and liquid crystal polyester.

From the viewpoint of durability, it is preferable to use a resin that is superior in pressure resistance, heat resistance, water absorbency, and moisture absorbency. The olefin-based resins and the polyester-based resins are superior in water absorbency and moisture absorbency to the polyimide-based resins.

The wiring layers 32a and 32b are made of a metallic material (e.g., copper) having good thermal conductivity and electrical characteristics, and they are laminated on the organic insulating layer 30 with intervention of an adhesive layer (not illustrated) made of, e.g., prepreg, or without intervention of any adhesive layer. A highly heat-conductive filler may be mixed in the adhesive layer. A thickness of the wiring layer 32a is set to 10 to 35 µm, preferably 10 to 20 µm, for example. A thickness of the wiring layer 32b is set to 25 to 50 µm, preferably 30 to 40 µm, for example.

The wiring layers 32a and 32b are not always required to cover the entire surface of the organic insulating layer 30, and they may be disposed only in regions (land portions) necessary for electrical connection of the LED chip 3. Respective surfaces of the wiring layers 32a and 32b are preferably coated with a metal plating (such as a gold plating, a silver plating, a rhodium plating, or a solder plating). The plating aims to prevent oxidation during baking of the substrate and to ensure bonding performance.

The upper and lower wiring layers 32a and 32b are electrically connected to each other through the via 33. The via 33 may be in the form of simple plating connection. However, when the via 33 is to serve as a thermal via capable of conducting heat, an inner hole of the via 33 may be filled with a metallic material (e.g., copper). From the viewpoint of heat dissipation, the via 33 is preferably disposed to be positioned just under the LED chip 3 or in the vicinity thereof. The via 33 may be formed by providing one or plural columnar vias, each having a smaller cross-sectional area than the LED chip 3, just under the LED chip 3, or by providing a columnar via having a larger cross-sectional area than the LED chip 3.

The cutout 34 is provided to avoid the wiring layers 32a and 32b from being short-circuited when the substrate is cut with a cutting blade as described later.

The above-described white insulating layer 14 is formed as a coating on an upper surface of the wiring layer 32a except for the regions (land portions) necessary for electrical connection of one or plural LED chips 3. High reflectance and high resistance against drop-off can be realized by filling the white insulating layer 14 into the separation portion 28a as well. A thickness of the white insulating layer 14 is determined in view of balance among reflectance, workability, insulation performance, and thermal conductivity, and it is set to 30 to 60 µm, preferably 40 to 50 µm, for example. The thickness of the white insulating layer 14 is preferably set to 40 µm or greater from the viewpoint of ensuring the reflectance of 95% or greater.

The LED chip 3 is fixed to the upper surface of the package substrate 2 by employing a die bonding material and is connected to the wiring layer 32a by wire bonding. The transparent resin 5 is then filled for encapsulation. The resin encapsulation is performed by the batch encapsulation method of encapsulating a plurality of chips at a time, and then dividing the chips individually. From the viewpoint of dicing, the Shore D hardness of the encapsulation resin 5 needs to be 80 or greater, and it is more preferably 86 or greater. The results of experiments show that the dicing cannot be performed with high accuracy at the Shore D hardness of 81, but satisfactory results are obtained at the Shore D hardness of 87 or 88.

One example of a manufacturing process for the LED package 1 according to the seventh configuration example will be described below.

(1) A laminate is fabricated in which the wiring layers 32a and 32b, each being a copper foil, are formed respectively on the upper and lower surfaces of the organic insulating layer 30. A method of laminating the wiring layers 32a and 32b is not limited to particular one, and any suitable method, such as rolling lamination, plating, or vapor deposition, can be used to laminate the wiring layers 32a and 32b. A multilayer film made of a metal foil provided with a resin can also be used.

(2) The via 33 is formed in the fabricated laminate by employing a tool, such as a drill. Then, the via 33 is filled with a conductive material (e.g., a solder, copper, or silver) having good heat dissipation performance by, e.g., plating or screen printing of a conductive paste.

(3) Resists are coated over the wiring layers 32a and 32b. The wiring layers 32a and 32b are completed by exposing patterns to the coated resists, developing and etching the patterns, and then removing the resists. It is to be noted that the steps (2) and (3) may be performed in reversed order, or that the via may be plated integrally with the patterns on the front and rear sides.

(4) Surface treatment is performed to facilitate electrical connection (wire bonding or flip chip mounting) in the regions where the chip and the wiring are connected to each other. The surface treatment is performed, for example, by partial silver plating, a method of coating and baking a silver paste, or a method of coating and baking a silver ink. This step may be performed after (8) described below.

(5) The white insulating layer 14 is formed on the wiring layer 32a by coating white inorganic ink by screen printing, for example.

(6) A multi-unit substrate in size corresponding to many unit-size substrates, which has been obtained through the above-mentioned steps, is baked at low temperature for a short time (e.g., 40° C.×10 minutes). The above-described steps can be performed in a hoop line.

(7) A frame substrate, i.e., an assembly of plural package substrates 2, is obtained by cutting the multi-unit substrate with a cutting blade.

(8) The frame substrate is baked at high temperature for a long time (e.g., 200° C.×60 minutes). The frame substrate before chip mounting is completed through the above-described steps. In this respect, the baking is preferably performed in a reducing atmosphere (containing nitrogen and hydrogen of 4% or smaller, for example) to prevent oxidation of the copper foil on the substrate lower side, which serves as an electrode for substrate connection. This is not applied to the case where the electrode pattern is covered with the metal plating.

(9) The LED chips 3 are mounted to the frame substrate and are electrically connected to the wiring layer by wire bonding (or flip chip mounting).

(10) Resin encapsulation is performed on the frame substrate at a time by the transfer mold method, for example.

(11) The frame substrate is divided (called dicing) along division lines 35 with a cutting blade, whereby the individual LED packages 1 are obtained. FIG. 12 illustrates, in image form, the dicing process and one of the individual LED packages 1.

FIG. 13 illustrates a modification in which the LED chip 3 insulated at its rear surface is arranged in the recessed placement portion 16 and is fixed there with a highly heat-conductive adhesive. In the placement portion 16 and a land 36, the white insulating layer 24 is not formed and the wiring layer 32a is exposed.

FIG. 14 illustrates a modification in which the LED chip 3 is flip-chip mounted. In this modification, the LED chip 3 is flip-chip mounted in a state connected, through the electrical connection portions 31, to regions of the wiring layer 32a where the white insulating layer is not formed.

FIG. 15 illustrates a modification in which a phosphor is arranged on the LED chip 3. In this modification, a phosphor 38 is arranged on the LED chip 3. The transparent resin 5 is mixed with a phosphor in some cases and is not mixed with a phosphor in other cases. In the latter cases, the desired color (e.g., white) can be obtained through mixing of colors by selecting a color (e.g., yellow) of the phosphor 38 on the LED chip 3 and a color (e.g., blue) of the phosphor mixed in the transparent resin 5 to be different from each other.

FIG. 16 illustrates an eighth configuration example of the LED package; specifically, FIG. 16(a) is a side sectional view, FIG. 16(b) is a seeing-through perspective view of main components, and FIG. 16(c) is a plan view (in which a silver plating layer is omitted).

The LED package 1 according to the eighth configuration example is similar to the seventh configuration example in that the package substrate 2 includes the organic insulating layer 30, the wiring layers 32a and 32b sandwiching the organic insulating layer 30, the via 33 connecting the wiring layers 32a and 32b to each other, and the cutout 34. However, the LED package 1 according to the eighth configuration example is different from the seventh configuration example in including a silver plating layer (metallic thin film layer) 37 formed on the upper surface of the wiring layer 32a.

The above-described solder resist layer 15 made of the transparent inorganic material may be formed, as required, on a surface of the silver plating layer 37 except for the regions (land portions) necessary for electrical connection of the LED chip 3.

Moreover, instead of the silver plating layer 37, the white insulating layer 14 may be formed on the upper surface of the wiring layer 32a.

In the eighth configuration example, the separation portion 28a extending in a first direction is provided in the upper wiring layer 32a, and the separation portion 28b extending in a second direction, which is different from the first direction, is provided in the lower wiring layer 32b. The reason why the first direction and the second direction are set different from each other resides in not only ensuring rigidity and flatness of the substrate, but also in increasing an area that is effective to dissipate heat. An angle formed by the first direction and the second direction may be set different from 90 degrees unlike FIG. 16. The separation portion 28a and/or the separation portion 28b is not always necessarily formed in a linear shape, and may be formed in a bent (L-like) shape as illustrated in FIG. 17. In the latter case, parts (shorter than a half the total length) of the separation portion 28a and/or the separation portion 28b may extend in the same direction as the first direction.

Preferably, the wiring layer 32a has an area as large as possible (namely, the wiring layer 32a covers, e.g., 80 to 90% or greater of the organic insulating layer 30) in order to increase the heat dissipation performance. In particular, the area of the wiring layer 32a on the side where the LED chip 3 is mounted is maximized. Furthermore, a thermal via for transferring heat, conducted to the wiring layer 32a, to the wiring layer 32b is preferably provided in a cross-sectional area of a certain value or more. It is particularly preferable that a total cross-sectional area of the thermal via is larger in a region (denoted by 321) of the wiring layer 32a on the side where the LED chip 3 is mounted than in a region (denoted by 322) of the wiring layer 32a on the side separated from the LED chip 3 by the separation portion 28a.

An inner hole of the via 33 is filled with a metallic material (e.g., copper). From the viewpoint of heat dissipation, the via 33 is preferably disposed to be positioned just under the LED chip 3 or in the vicinity thereof. The via 33 may be formed by providing many columnar vias each having a relatively small cross-sectional area, or several columnar vias each having a relatively large cross-sectional area.

FIG. 18 is a side sectional view illustrating an LED package according to a ninth configuration example.

The LED package 1 of this configuration example is featured in including a lens-shaped resin cover 39 that contains a phosphor.

An end opening area of the resin cover 39 is preferably set to be as close as possible to the package size from the viewpoint of ensuring sufficient rigidity. Inert gas (e.g., nitrogen or argon) may be filled in a space within the resin cover 39.

The above-described white insulating layer 14 is formed as a coating on the upper surface of the wiring layer 32a except for the regions (land portions) necessary for electrical connection of the LED chip 3. The above-described solder resist layer 15 made of the transparent inorganic material may be formed instead of the white insulating layer 14.

According to the LED package 1 of this configuration example, since the phosphor is positioned away from the LED chip 3, the phosphor can be avoided from being affected by the generated heat, and an amount of the phosphor to be used can be reduced.

FIG. 19 is a side sectional view illustrating a power semiconductor package according to a tenth configuration example.

Because a power semiconductor device generates a larger amount of heat than other semiconductor devices, it is required to efficiently dissipate the heat through a heat dissipating member made of a metal plate, for example.

A package substrate 40 to which a power semiconductor package 41 according to the tenth configuration example is mounted includes a substrate insulating layer 42, the wiring layers 32a and 32b sandwiching the substrate insulating layer 42, the via 33 connecting the wiring layers 32a and 32b to each other, and the cutout 34.

The substrate insulating layer 42 is made of glass cloth or glass unwoven fabric impregnated with a liquid material that is an inorganic material and that functions as a heat conduction material. For example, the above-described white inorganic ink can be used as the liquid material. A white inorganic pigment to be added is, for example, titanium dioxide ($TiO_2$) or magnesium oxide (MgO) (MgO is preferable from the viewpoint of thermal conductivity). The thermal conductivity may be increased by adding a highly heat-conductive filler made of an inorganic material (e.g., silicon carbide (SiC) coated with an nm-size alumina film, or $SiO_2$ particles).

A thickness of the substrate insulating layer 42 is determined in view of balance between insulation performance and thermal conductivity, and it is 12 to 30 µm, for example. The glass cloth or the glass unwoven fabric used here is preferably the cloth or the fabric having a low dielectric characteristic and being commonly used for printed wiring substrates.

The wiring layers 32a and 32b are similar to those in the seventh configuration example and are made of a metallic material (e.g., copper) having good thermal conductivity and electrical characteristics. The wiring layers 32a and 32b are laminated on the substrate insulating layer 42 with intervention of an adhesive layer (not illustrated) made of, e.g., prepreg, or without intervention of any adhesive layer. A thickness of the wiring layer 32a is set to 30 to 100 µm, for example. A thickness of the wiring layer 32b is set to 50 to 300 µm, for example.

The upper and lower wiring layers 32a and 32b are electrically connected to each other through the via 33. An inner hole of the via 33 is filled with a metallic material (e.g., copper) so that the via 33 may serve as a thermal via capable of conducting heat. The wiring layers 32a and 32b and the via 33 are formed by coating a metallic paste material, e.g., a copper paste, by printing (screen printing or flexo printing) or using a dispenser, and then baking the coated paste material. The via 33 can be formed, for example, by forming an opening with a drill after forming one of the wiring layers, filling the opening with the paste material at the same time as when the other wiring layer is formed, and then baking the paste material at the same as the baking of the wiring layers.

An inorganic insulating layer 44 is formed as a coating on the upper surface of the wiring layer 32a except for regions (land portions) necessary for electrical connection of one or plural power semiconductor chips 43. The inorganic insulating layer 44 is formed by coating white inorganic ink, a sol (liquid coating agent) containing $SiO_2$ (mean particle diameter: 50 nm or smaller), or a solution containing polysilazane at necessary locations by printing (screen printing or flexo printing), the ink jet method, or the dispenser method, and then baking the coated ink, sol or solution.

It is to be noted that the inorganic insulating layer 44 may be omitted when the semiconductor chip to be mounted is a power semiconductor and when voltage resistance is not needed.

A power semiconductor chip 43 is fixed to an upper surface of the package substrate 40 with a die bonding material and is connected to the wiring layer 32a by wire bonding. An encapsulation resin 45 is then filled. A placement portion where the wiring layer 32a is exposed, or a projected placement portion 47 (described later) may be provided on the upper surface of the package substrate 40, and the power semiconductor chip 43 may be placed in or on such a placement portion. It is to be noted that the power semiconductor chip 43 may be replaced with another semiconductor chip, such as an LED. In the case of the LED, a thickness of the inorganic insulating layer 44 is determined in view of balance among reflectance, workability, insulation performance, and thermal conductivity, and it is set to 30 to 60 µm, for example.

According to the power semiconductor package 41 of this configuration example, it is possible to provide a semiconductor substrate of which materials are all inorganic materials. Moreover, since the wiring layers and the inorganic insulating layer can be formed by printing, for example, the cost can be reduced.

FIG. 20 is a side sectional view illustrating an LED package according to an eleventh configuration example, and FIG. 21 is a top plan view illustrating the LED package according to the eleventh configuration example.

The LED package 1 of the eleventh configuration example is similar to that of the fifth configuration example in mounting a plurality of LED chips 3, but it is different mainly in including a projected placement portion 47 provided on the upper surface of the package substrate 2.

A base material of the package substrate 2 is a material having good thermal conductivity and electrical characteristics, and it is a copper plate or an aluminum plate, for example. The projected placement portion 47 is provided on the package substrate 2 at a location where the LED chip 3 is to be mounted. The projected placement portion 47 is constituted as a member having good thermal conductivity and is formed, for example, by coating and baking a metallic paste material, such as a copper paste, a silver paste, or a solder paste. Alternatively, the projected placement portion may be formed by etching a metallic substrate. When the substrate includes a structure forming a heat pipe with stacked copper plates, the copper plates may be stacked after forming the projected placement portion on only the uppermost copper plate. An upper surface of the projected placement portion 47 is formed as a flat surface in consideration of adhesion with the rear surface of the LED chip 3.

In a region (reflecting region 49) of the package substrate 2 around the projected placement portion 47, the white insulating layer 14 is formed at a height substantially flush with the projected placement portion 47 or slightly lower than the projected placement portion 47. The reflecting region 49 is a substantially flat surface. A thickness of the white insulating layer 14 may be changed between the reflecting region 49 and a region outside the reflecting region 49. For example, the white insulating layer 14 may be thicker in the region outside the reflecting region 49 than in the reflecting region 49 to increase the voltage resistance.

The reflecting region 49 is surrounded by a dam member 48 having a light reflection property at least in its surface, and the transparent resin 5 is filled inside the dam member 48. The dam member 48 serves to prevent flowage of the encapsulation resin during the manufacturing, and it is made of a rein or metallic material. While the dam member 48 is fixedly provided in this configuration example, the dam member 48 may be removably provided instead. The transparent resin 5 may be mixed with a phosphor.

The LED chips 3 are arranged in an array of n rows×m columns (e.g., 5 row×5 columns) within the reflecting region 49 and are COB (Chip On Board) mounted. Each LED chip 3 is connected to the wiring 13 or the adjacent LED chip 3 through gold thin wires, for example, by wire bonding. The rear surface (lower surface) of the LED chip 3 is fixed to the projected placement portion 47 with a highly heat-conductive adhesive, for example.

According to the LED package 1 of this configuration example, since heat generated from the LED chip 3 can be efficiently dissipated to the package substrate 2 through the projected placement portion 47, an LED package having good heat dissipation performance can be provided.

FIG. 22 is a side sectional view illustrating an LED package according to a twelfth configuration example.

The LED package 1 of the twelfth configuration example is similar to that of the eleventh configuration example in COB-mounting a plurality of LED chips 3, but it is different in including a metallic thin film layer 50 provided on the upper surface of the package substrate 2.

In this configuration example, the metallic thin film layer 50 made of silver, chromium, nickel, or aluminum, for example, is formed on the upper surface of the package substrate 2 by, e.g., plating, vapor deposition, or painting. The thickness of the white insulating layer 14 can be reduced in an amount corresponding to the thickness of the metallic thin film layer 50, whereby the heat dissipation effect can be increased.

The projected placement portion 47 is similar to that in the eleventh configuration example and is formed, for example, by coating and baking a metallic paste material, such as a copper paste, a silver paste, or a solder paste.

One example of a manufacturing process for the LED package 1 according to the twelfth configuration example will be described below.

(1) The metallic thin film layer 50 is formed on the substrate by, e.g., plating, vapor deposition, or painting.

(2) On the metallic thin film layer 50, the projected placement portion 47 is formed by coating a metallic paste material at necessary locations with drawing using the ink jet method or the dispenser method, and then baking the coated paste material into a metallized state.

(3) A frame substrate, i.e., an assembly of plural package substrates 2, is obtained by coating white inorganic ink over regions of the substrate except for the projected placement portions 47 by printing (screen printing or flexo printing), the ink jet method, or the dispenser method, and then baking the coated ink at 200° C.×60 minutes, for example.

(4) The wiring 13 is formed by etching of a copper foil, or screen printing, for example.

(5) The LED chips 3 are mounted to the frame substrate and are electrically connected to the wiring by wire bonding.

(6) A resin is filled for encapsulation of the frame substrate, and the frame substrate is cut with a cutting blade, whereby the individual LED packages 1 are obtained.

According to the LED package 1 of this configuration example, since the thickness of the white insulating layer 14 can be reduced and heat generated from the LED chip 3 can be more efficiently dissipated to the package substrate 2 through the projected placement portion 47, an LED package having good heat dissipation performance can be provided. Furthermore, since the thickness of the white insulating layer 14 can be reduced, it is also possible to realize diversification of the method for coating the white inorganic ink, and higher efficiency of the production process.

FIG. 23 is a side sectional view illustrating an LED package according to a thirteenth configuration example.

The LED package 1 of the thirteenth configuration example is different from that of the twelfth configuration example in that the projected placement portion 47 is not provided on the upper surface of the package substrate 2, and the placement portion 16 is provided instead.

In this configuration example, the metallic thin film layer 50 made of silver, chromium, nickel, or aluminum, for example, is formed on the upper surface of the package substrate 2 by, e.g., plating, vapor deposition, or painting. Then, the recessed placement portion 16 is formed such that the metallic thin film layer 50 is exposed in the recessed placement portion 16. As a result, the reflection effect and the heat dissipation effect are both realized.

According to this configuration example, the reflection effect of the exposed metallic thin film layer 50 can be obtained even when the area of the placement portion 16 is somewhat larger than the bottom area of the LED chip 3.

While several embodiments have been described in detail above for merely illustrative purpose in this disclosure, the present invention can be embodied in variously modified forms without departing in essence from the novel teaching and the advantageous effects of the present invention.

LIST OF REFERENCE SYMBOLS

1 LED package
2 package substrate
3 LED chip
4 white resin
5 transparent resin
11 LED illumination module (LED module)
12 module substrate (wiring substrate)
13 wiring
14 white insulating layer
15 solder resist layer
16 placement portion
17 opening
18 insulating adhesive
19 electrical connection portion
20 highly heat-conductive adhesive
21 metal plate
22 recess
23 wiring
24 white insulating layer
25 edge portion
26 connection electrode
27 wiring not-formed portion
28 separation portion
29 heatsink
30 organic insulating layer
31 electrical connection portion
32 wiring layer
33 via
34 cutout
35 division line
36 land
37 silver plating layer
38 phosphor
39 resin cover
40 package substrate
41 power semiconductor package
42 substrate insulating layer
43 power semiconductor chip
44 inorganic insulating layer
45 encapsulation resin
46 module substrate
47 projected placement portion
48 dam member
49 reflecting region
50 metallic thin film layer

The invention claimed is:
1. A semiconductor device comprising:
a first substrate to which a semiconductor chip is directly or indirectly mounted,
a white insulating layer formed on a reflecting region of the first substrate and functioning as a reflecting material, and a wiring pattern connected to electrodes is formed on the white insulating layer, wherein a surface of the reflecting region is substantially flat and made of a metal, and the white insulating layer is formed on the surface of the reflecting region wherein the semiconductor chip is an LED chip disposed in the reflecting region, wherein the wiring pattern is formed on the surface of the white insulating layer, wherein the white insulating layer includes white inorganic pigments and $SiO_2$ particles having a mean particle diameter of several nm to several hundred nm, wherein a rate of $SiO_2$ particles and the white inorganic pigment contained in the white insulating layer is 80% by weight or greater, wherein a rate of the white inorganic pigments contained in the white insulating layer is 40% by weight or greater, wherein a rate of the $SiO_2$ particles contained in the white insulating layer is 25% by weight or greater, and wherein a bottom surface or a side surface of the LED chip is adjacent to the white insulating layer.

2. The semiconductor device according to claim 1, wherein a mean particle diameter of the white inorganic pigments is 1 μm or smaller.

3. The semiconductor device according to claim 1, wherein the first substrate is a module substrate to which an LED package including an LED chip is mounted.

4. The semiconductor device according to claim 1, wherein a rate of the $SiO_2$ particles contained in the white insulating layer is 30 to 40% by weight.

5. The semiconductor device according to claim 1, wherein the white inorganic pigments are one of titanium dioxide, magnesium oxide, alumina, and zinc oxide, or a combination of the aforesaid oxides.

6. The semiconductor device according to claim 1, wherein the white insulating layer is a laminated layer made up of a first layer containing first white inorganic pigments and a second layer containing second white inorganic pigments that are different from the first white inorganic pigments.

7. The semiconductor device according to claim 1, wherein a thickness of the white insulating layer is 10 to 150 μm.

8. The semiconductor device according to claim 1, wherein the wiring is formed by coating ink containing silver particles and copper particles with drawing.

9. The semiconductor device according to claim 1, wherein the first substrate is a module substrate to which a plurality of LED chips are mounted.

10. The semiconductor device according to claim 1, wherein a rate of the white inorganic pigment contained in the white insulating layer is 40 to 70% by weight.

11. The semiconductor device according to claim 6, wherein the first white inorganic pigments are one of titanium dioxide, magnesium oxide, alumina, and zinc oxide, or a combination of the aforesaid oxides, and the second white inorganic pigments are one of titanium dioxide, magnesium oxide, alumina, and zinc oxide, or a combination of said oxides.

12. The semiconductor device according to claim 1, wherein a placement portion in which the metal surface is exposed is formed at a position where the semiconductor chip is arranged.

13. The semiconductor device according to claim 1, wherein the placement portion is a projected placement portion.

14. The semiconductor device according to claim 1, wherein a thickness of the white insulating layer is 15 to 100 μm.

* * * * *